United States Patent
Saida et al.

(10) Patent No.: US 11,800,755 B2
(45) Date of Patent: Oct. 24, 2023

(54) DISPLAY DEVICE

(71) Applicant: SHARP KABUSHIKI KAISHA, Sakai (JP)

(72) Inventors: Shinsuke Saida, Osaka (JP); Tohru Okabe, Osaka (JP); Shinji Ichikawa, Osaka (JP); Ryosuke Gunji, Sakai (JP); Hiroki Taniyama, Osaka (JP); Hiroharu Jinmura, Yonago (JP); Akira Inoue, Yonago (JP); Yoshihiro Nakada, Yonago (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 640 days.

(21) Appl. No.: 17/042,849

(22) PCT Filed: Mar. 30, 2018

(86) PCT No.: PCT/JP2018/013940
§ 371 (c)(1),
(2) Date: Sep. 28, 2020

(87) PCT Pub. No.: WO2019/187137
PCT Pub. Date: Oct. 3, 2019

(65) Prior Publication Data
US 2021/0020733 A1    Jan. 21, 2021

(51) Int. Cl.
*H10K 59/124* (2023.01)
*H10K 59/131* (2023.01)
(Continued)

(52) U.S. Cl.
CPC ....... *H10K 59/131* (2023.02); *H10K 59/1201* (2023.02); *H10K 59/122* (2023.02); *H10K 59/124* (2023.02)

(58) Field of Classification Search
CPC ............. H10K 59/131; H10K 59/1201; H10K 59/122; H10K 59/124; H10K 50/8426;
(Continued)

(56) References Cited

U.S. PATENT DOCUMENTS

2010/0252857 A1    10/2010  Nakatani et al.
2014/0332769 A1    11/2014  Lee et al.
(Continued)

FOREIGN PATENT DOCUMENTS

JP    2015-043319 A    3/2015
JP    2016-039029 A    3/2016
(Continued)

*Primary Examiner* — Elias Ullah
(74) *Attorney, Agent, or Firm* — ScienBiziP, P.C.

(57) ABSTRACT

In the display device according to the disclosure, a first bank includes a first bank lower portion in the same layer as a flattening film and a first bank upper portion in the same layer as an edge cover. A second bank includes a second bank lower portion in the same layer as the flattening film and a second bank upper portion in the same layer as the edge cover. The first bank upper portion covers an upper surface and a side surface of the first bank lower portion, the side surface being on a side close to a display region. An inclination angle of a side surface of the first bank upper portion on a side close to the display region is larger than an inclination angle of the side surface of the first bank lower portion on the side close to the display region.

13 Claims, 19 Drawing Sheets

(51) Int. Cl.
  *H10K 59/122* (2023.01)
  *H10K 59/12* (2023.01)

(58) Field of Classification Search
  CPC .......... H10K 50/00; G09F 9/30; H05B 33/06;
  H05B 33/12; H05B 33/22
  See application file for complete search history.

(56) References Cited

U.S. PATENT DOCUMENTS

| | | |
|---|---|---|
| 2016/0043161 A1 | 2/2016 | Miyazawa |
| 2016/0064686 A1 | 3/2016 | Odaka et al. |
| 2016/0307971 A1 | 10/2016 | Jeon |

FOREIGN PATENT DOCUMENTS

| | | |
|---|---|---|
| JP | 2016-054038 A | 4/2016 |
| JP | 2016-054085 A | 4/2016 |
| WO | 2009/075075 A1 | 6/2009 |

DISPLAY DEVICE

TECHNICAL FIELD

The disclosure relates to a display device.

Background Art

Frame narrowing of a display device has been demanded.

CITATION LIST

Patent Literature

PTL 1: JP 2015-043319 A (published on Mar. 5, 2015)
PTL 2: JP 2016-039029 A (published on Mar. 12, 2016)
PTL 3: JP 2016-054085 A (published on Apr. 14, 2016)
PTL 4: WO 2009/075075 (published on Jun. 18, 2009)

SUMMARY

Technical Problem

An object of one aspect of the disclosure is to achieve frame narrowing of a display device.

Solution to Problem

A display device according to an aspect of the disclosure includes: an inorganic insulating film; a metal layer as an upper layer of the inorganic insulating film; a flattening film as an upper layer of the metal layer; a plurality of first electrodes as an upper layer of the flattening film; an edge cover as an upper layer of the plurality of first electrodes; a plurality of light-emitting layers as an upper layer of the edge cover; a second electrode as an upper layer of the plurality of light-emitting layers, the second electrode being shared by the plurality of light-emitting layers; a first bank surrounding a display region, the first bank including a first bank lower portion in the same layer as the flattening film and a first bank upper portion in the same layer as the edge cover; a second bank surrounding the display region and the first bank, the second bank including a second bank lower portion in the same layer as the flattening film and a second bank upper portion in the same layer as the edge cover; and a terminal portion on an outer side with respect to the second bank, wherein the first bank upper portion covers an upper surface and at least a side surface of the first bank lower portion, the side surface being on a side close to the display region, and an inclination angle of a side surface of the first bank upper portion on a side close to the display region is larger than an inclination angle of the side surface of the first bank lower portion on the side close to the display region.

Advantageous Effects of Disclosure

According to an aspect of the disclosure, the display device can attain frame narrowing.

DESCRIPTION OF EMBODIMENTS

Hereinafter, "the same layer" means that the layer is formed in the same process (film formation process), "a lower layer" means that the layer is formed in an earlier process than the process in which the layer to be compared is formed, and "an upper layer" means that the layer is formed in a later process than the process in which the layer to be compared is formed.

Figure 1:
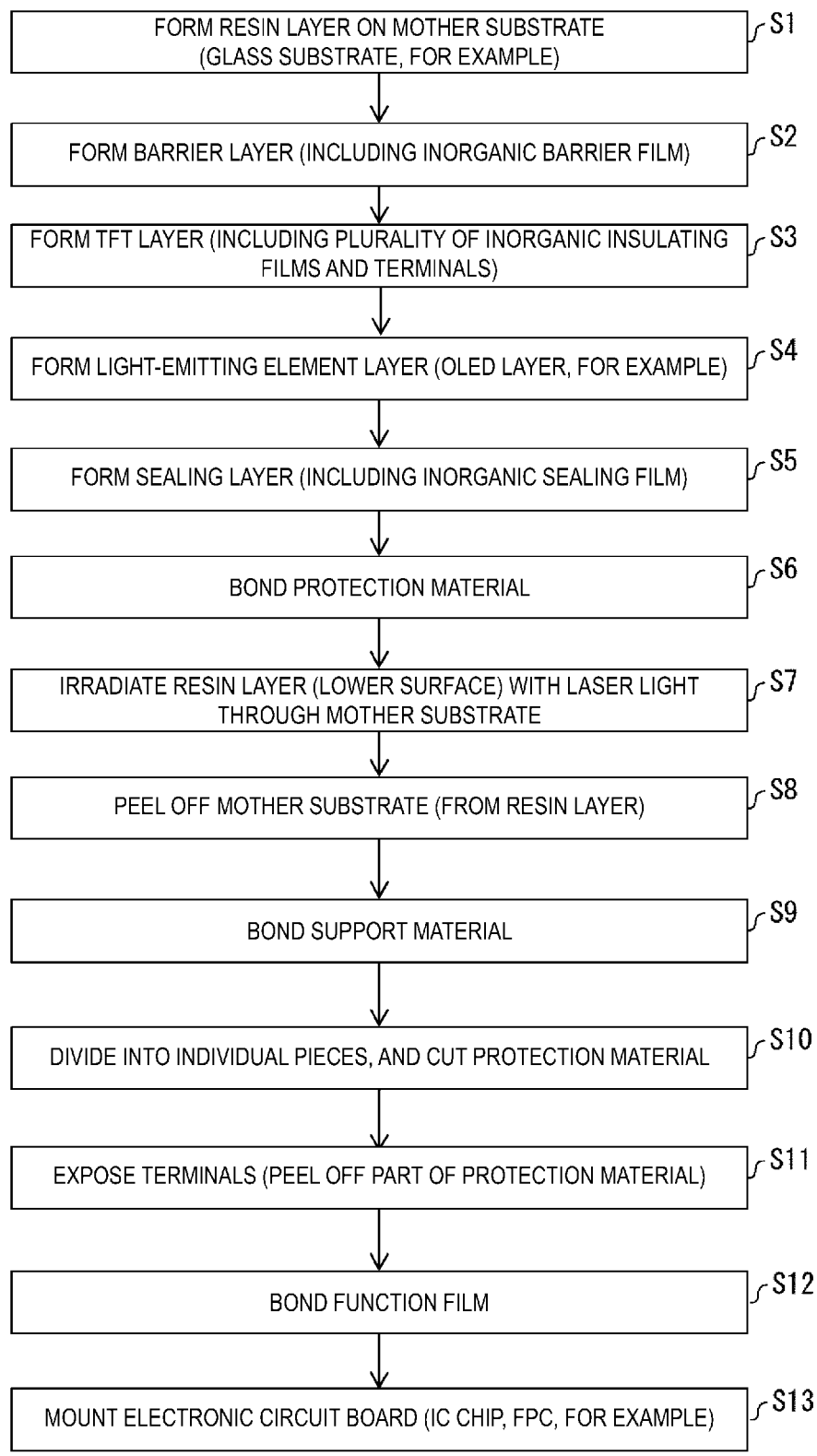
FIG. 1 is a flowchart illustrating an example of a manufacturing method for an EL device.
Figure 2:
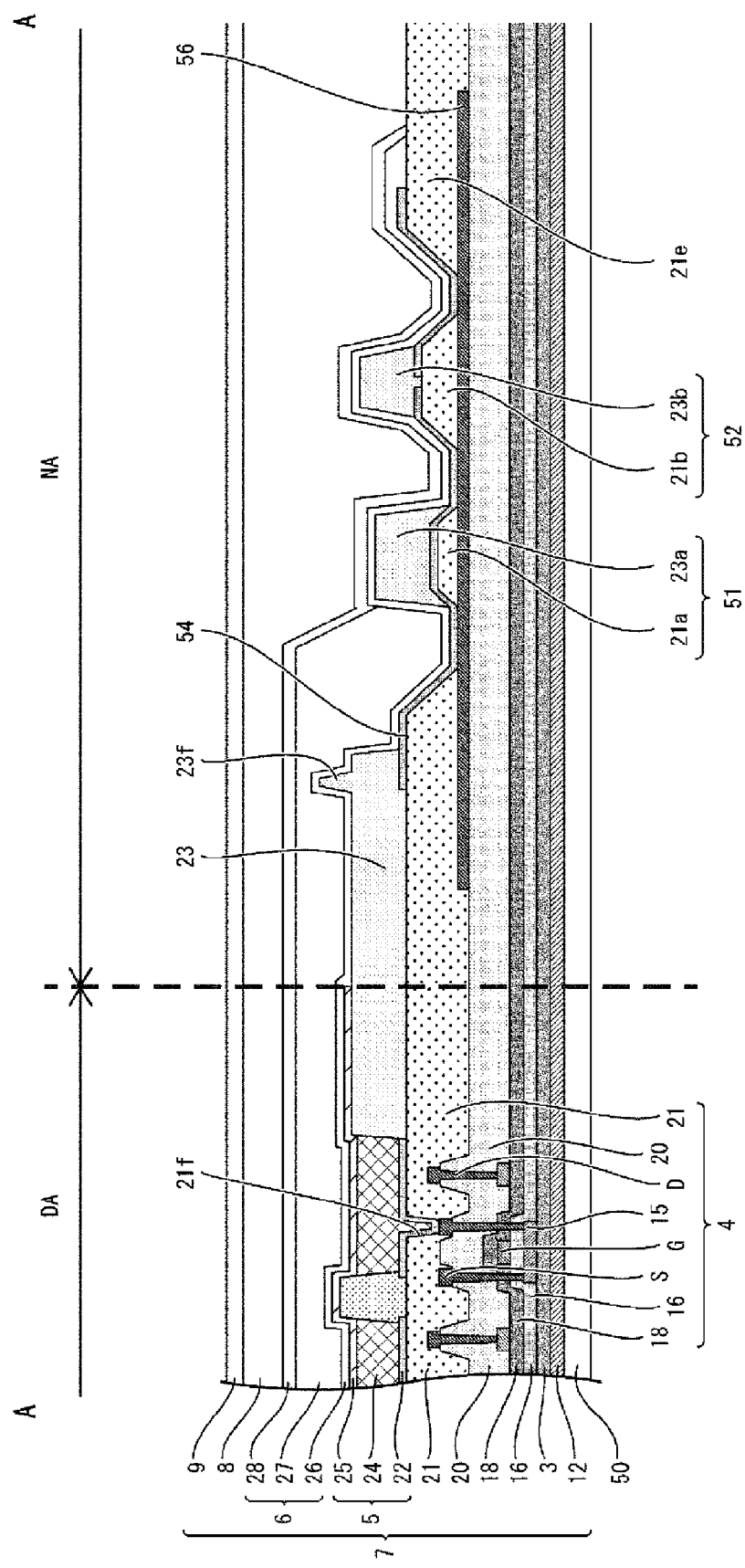
FIG. 2 is a cross-sectional view illustrating a configuration example of an EL device according to an embodiment of the disclosure during formation.
Figure 3:
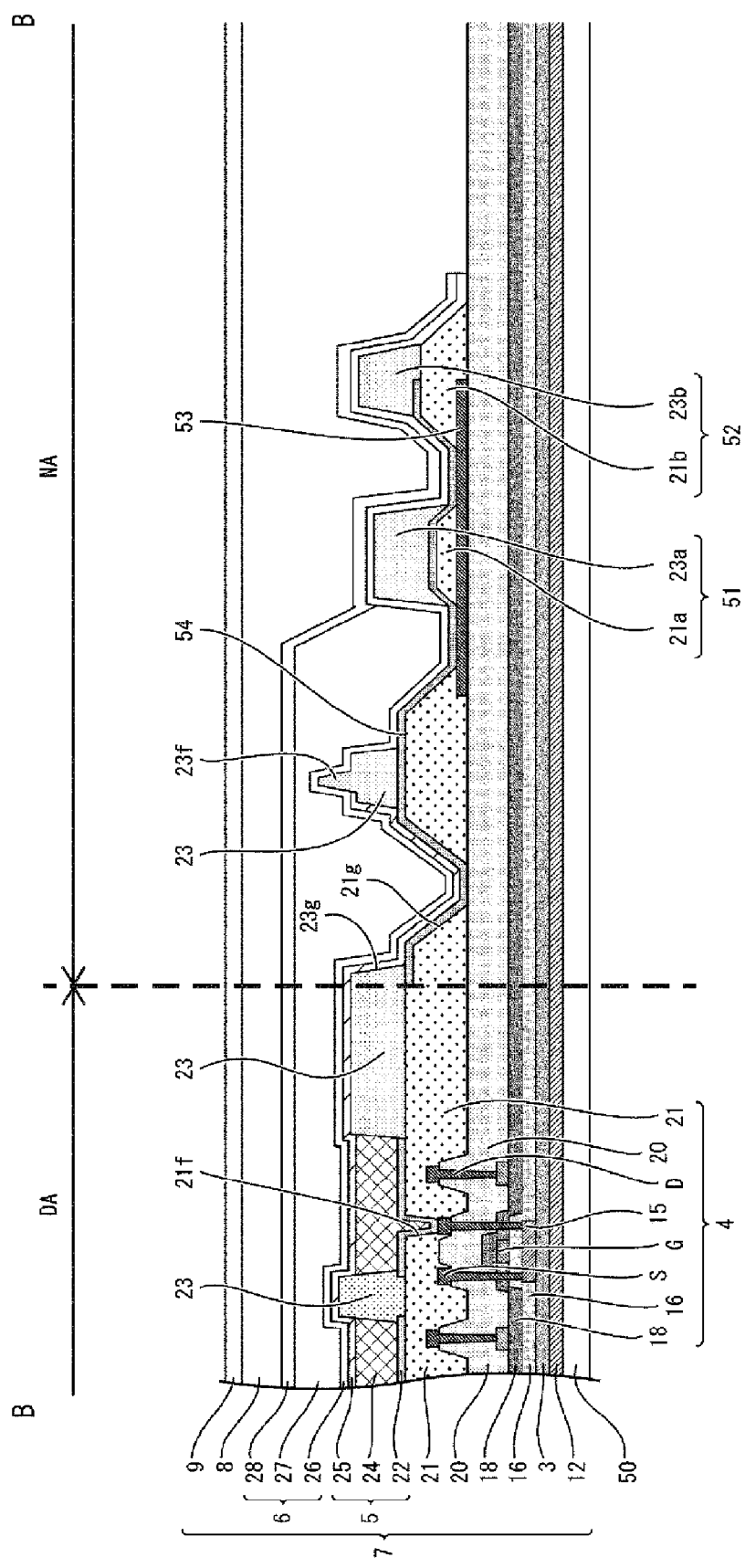
FIG. 3 is an another cross-sectional view illustrating a configuration example of the EL device according to the embodiment of the disclosure during formation.
Figure 4:
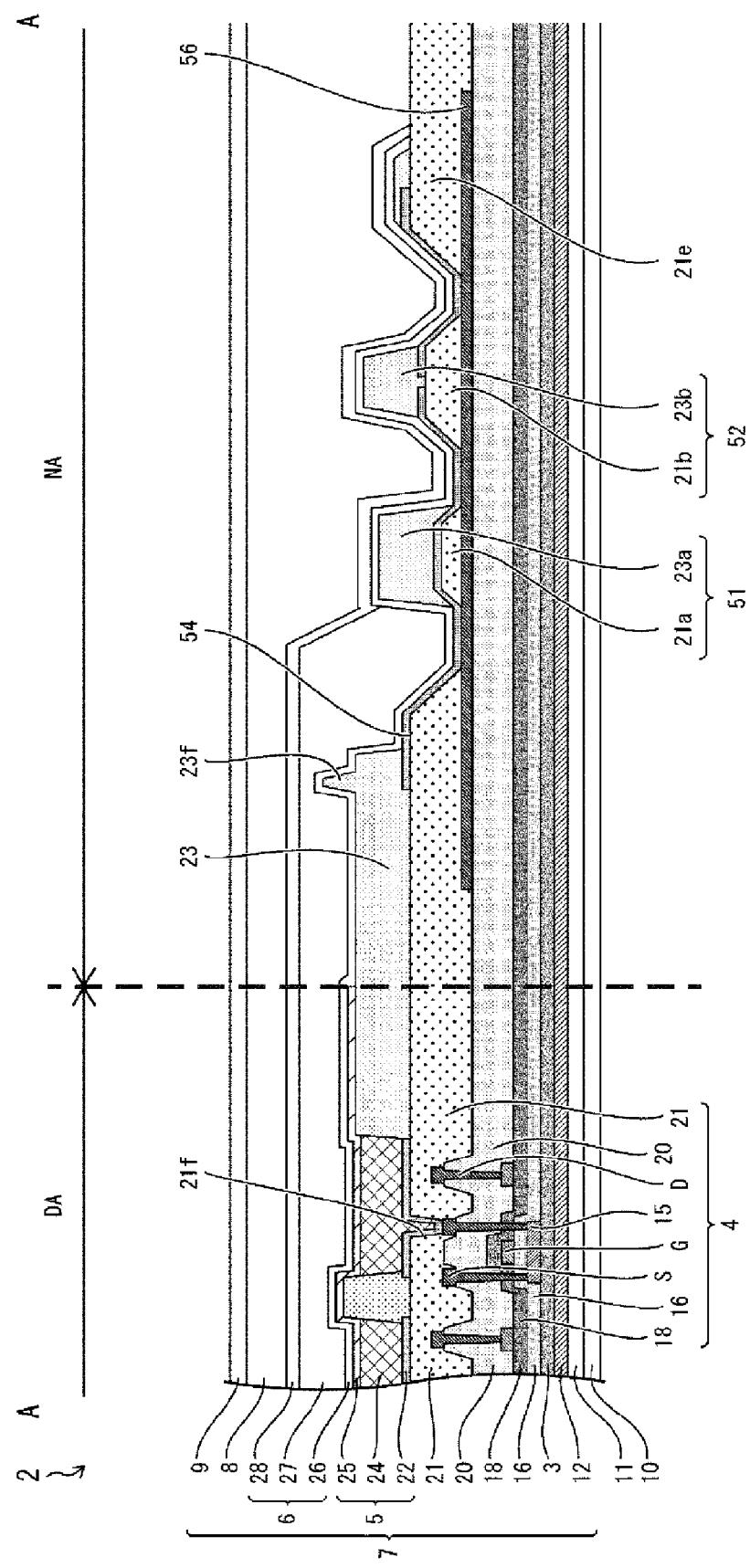
FIG. 4 is a cross-sectional view illustrating a configuration example of the EL device according to the embodiment of the disclosure.
Figure 5:
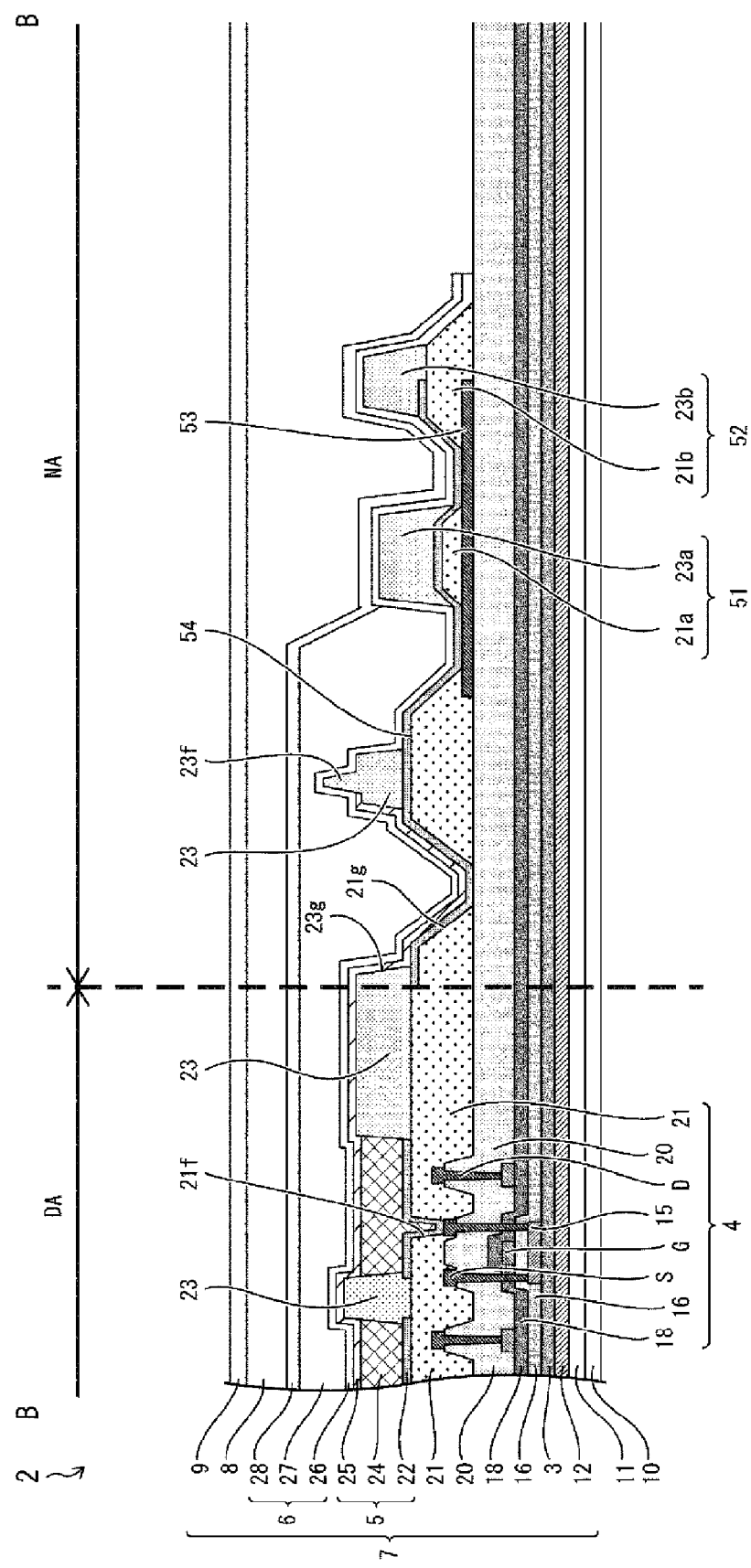
FIG. 5 is an another cross-sectional view illustrating a configuration example of the EL device according to the embodiment of the disclosure.
Figure 6:
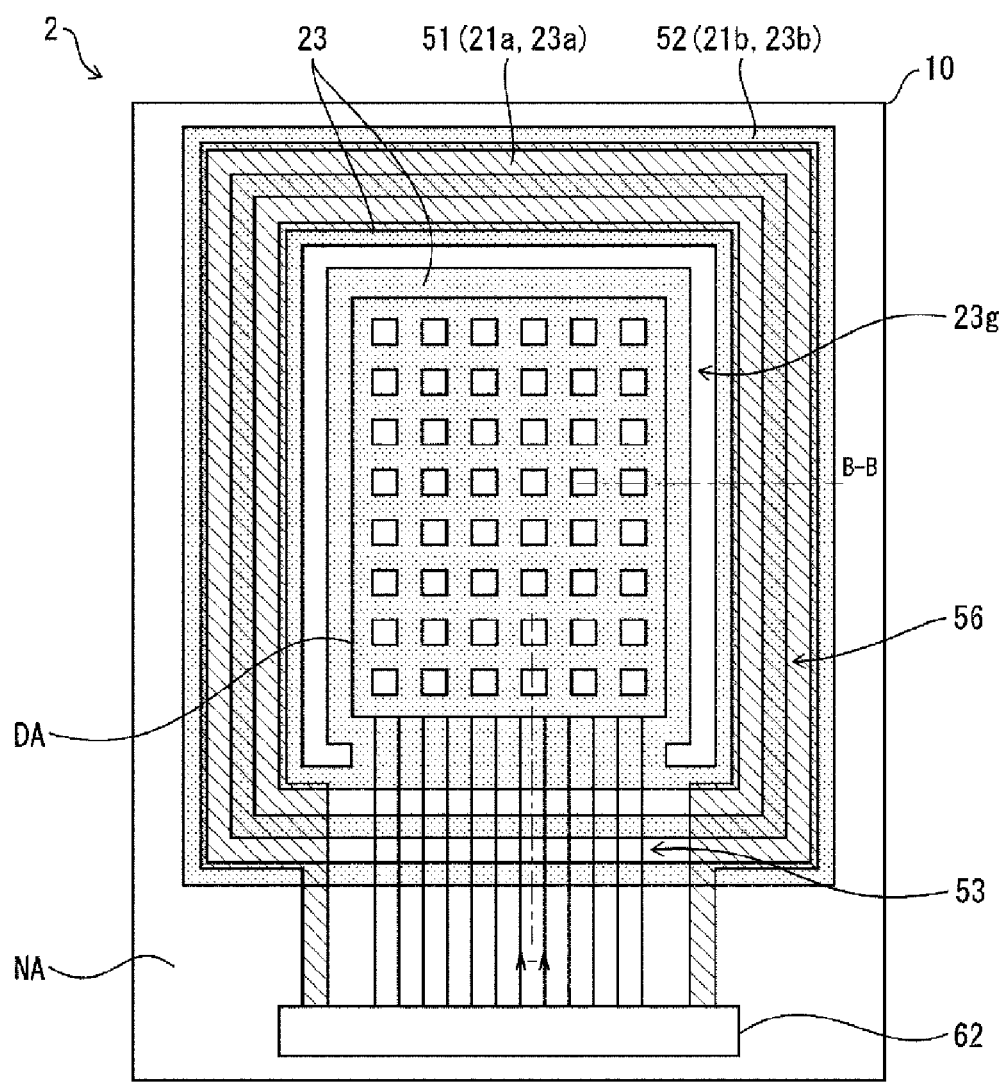
FIG. 6 is a plan view illustrating a schematic configuration of the EL device according to the embodiment of the disclosure.

FIG. 1 is a flowchart illustrating an example of a manufacturing method for an EL device. FIG. 2 and FIG. 3 are different cross-sectional views illustrating a configuration example of the EL device according to the present embodiment during formation. FIG. 4 and FIG. 5 are different cross-sectional views illustrating a configuration example of the EL device according to the present embodiment. FIG. 6 is a plan view illustrating a schematic configuration of the EL device according to the present embodiment. For convenience of illustration in FIG. 6, in a structure on a support material 10, only a first hank 51, a second bank 52, an edge cover 23, a trench 23g provided in the edge cover 23, a lead wiring line 53 (first conductive layer), a trunk wiring line 56 (first conductive layer), and a terminal portion 62 are illustrated. FIG. 2 and FIG. 4 correspond to cross-sectional views taken along the line A-A in FIG. 6, and FIG. 3 and FIG. 5 correspond to cross-sectional views taken along the line B-B in FIG. 6.

When a flexible EL device is manufactured, a resin layer 12 is first formed on a transparent mother substrate (e.g., a glass substrate) 50 (step S1), as illustrated in FIG. 1 to FIG. 5. Next, an inorganic barrier film 3 is formed (step S2). Subsequently, a TFT layer 4 is formed, the TFT layer 4 including a plurality of inorganic insulating films 16, 18, and 20, and a flattening film 21 (step S3). Next, a top-emitting type light-emitting element layer (for example, an organic light emitting diode (OLED) element layer) 5 is formed (step S4). Next, a sealing layer 6 is formed that includes a first inorganic sealing film 26, a second inorganic sealing film 28, and an organic sealing film 27 (step S5). Next, a protection material 9 (a PET film, for example) is bonded to the sealing layer 6, with an adhesive layer 8 interposed therebetween (step S6).

The manufacturing method for an EL device according to an aspect of the disclosure particularly has features in steps S3 and S4. Further, the EL device according to an aspect of the disclosure particularly has features in the first bank 51 and the second bank 52 that are formed in a frame shape in steps S3 and S4. Details thereof are described below.

Next, the resin layer 12 is irradiated with laser (step S7). Here, the resin layer 12 absorbs the emitted laser to cause a lower surface of the resin layer 12 (an interface with the mother substrate 50) to change in properties due to ablation. A peeling layer 13 is thus formed, which deteriorates a bonding force between the resin layer 12 and the mother substrate 50. Next, the mother substrate 50 is peeled from the resin layer 12 (step S8). Thereby, the mother substrate 50 is peeled off from a layered body 7 illustrated in FIG. 2 and FIG. 3. Herein, the layered body 7 indicates the entire multilayer body formed on the mother substrate 50, and, in the example illustrated in FIG. 2 and FIG. 3, indicates layers from the resin layer 12 formed on the mother substrate 50 to the protection material 9 which is the outermost layer.

Next, as illustrated in FIG. 4 and FIG. 5, the support material 10 (e.g., a PET film) is bonded to the lower surface of the resin layer 12 with an adhesive layer 11 interposed therebetween (step S9). Subsequently, the mother substrate 50 is divided while the protection material 9 is cut, so that a plurality of EL devices are cut (step S10). Next, the protection material 9 on a terminal portion of the TFT layer 4 is peeled off, and terminal exposure is performed (step S11), As a result, an EL device 2 (display device) illustrated in FIG. 4 and FIG. 5 is obtained. Then, a function film 39 is bonded (step S12), and an electronic circuit board is mounted on the terminal portion using an anisotropic conductive film (ACF) or the like (step S13). Each of the steps above is performed by a manufacturing apparatus of an EL device.

Examples of the material of the resin layer 12 include polyimide, epoxy, and poly amide. Among these, polyimide is preferably used.

The inorganic barrier layer 3 is a film configured to prevent moisture or impurities from reaching the TFT layer 4 or the light-emitting element layer 5 when the EL device is being used, and the inorganic barrier layer 3 may be made of a silicon oxide film, a silicon nitride film, or a silicon oxynitride film, or a layered film thereof, formed by CVD, for example. The thickness of the inorganic barrier layer 3 is, for example, from 50 nm to 1500 nm.

The TFT layer 4 includes a semiconductor film 15, an inorganic insulating film 16 (a gate insulating film) as an upper layer of the semiconductor film 15, a gate electrode G as an upper layer of the inorganic insulating film 16, inorganic insulating films 18 and 20 as upper layers of the gate electrode G, a source electrode S (metal layer) as an upper layer of the inorganic insulating film 20, a drain electrode D (metal layer), terminals TM and terminal wiring lines TW, and a flattening film 21 as an upper layer of the source electrode S and the drain electrode D. The semiconductor film 15, the inorganic insulating film 16, the gate electrode G, the inorganic insulating films 18 and 20, the source electrode S, and the drain electrode D constitute a thin film transistor (TFT). A terminal portion is formed in the end portion (non-display region NA) of the ITT layer 4, and the terminal portion includes the plurality of terminals TM used for coupling to an IC chip and an electronic circuit board such as an FPC, and the terminal wiring line TW. The terminals TM are electrically coupled to various wiring lines of the TFT layer 4 via the terminal wiring lines TW.

The semiconductor film 15 is made of a low-temperature polysilicon (LTPS) or an oxide semiconductor, for example. The gate insulating film 16 may be configured by a silicon oxide (SiOx) film or a silicon nitride (SiNx) film, or a layered film thereof, formed using CVD, for example. The gate electrode G, the source electrode S, the drain electrode D, and the terminals are formed of a metal single layer film or a layered film including, for example, at least one of aluminum (Al), tungsten (W), molybdenum (Mo), tantalum (Ta), chromium (Cr), titanium (Ti), and copper (Cu). Note that, in FIG. 2 to FIG. 5, the TFT provided with the semiconductor film 15 as the channel is illustrated as a top gate structure. However, the TFT may have a bottom gate structure (when the TFT channel is an oxide semiconductor, for example).

The inorganic insulating films 18 and 20 may be constituted by a silicon oxide (SiOx) film or a silicon nitride (SiNx) film, or a layered film thereof, formed using CVD.

The flattening film 21 is an organic insulating film and can be made of a coatable photosensitive organic material such as polyimide or acryl, for example.

The light-emitting element layer 5 (an organic light-emitting diode layer, for example) includes an anode electrode 22 (first electrode) as an upper layer of the flattening film 21, the edge cover 23 covering an edge of the anode electrode 22, an electroluminescence (EL) layer 24 (light-emitting layer) as an upper layer of the edge cover 23, and a cathode electrode 25 (second electrode) as an upper layer of the EL layer 24. The anode electrode 22, the EL layer 24, and the cathode electrode 25 form a light-emitting element (for example, an organic light-emitting diode). The edge cover 23 is an organic insulating film, and can be made of a coatable photosensitive organic material such as polyimide, epoxy, or acryl, for example.

The EL layer 24 is formed in a region (subpixel region) surrounded by the edge cover 23, by vapor deposition or an ink-jet method. When the light-emitting element layer 5 is an organic light-emitting diode (OLED) layer, for example, the EL layer 24 is formed by layering a hole injection layer, a hole transport layer, a light-emitting layer, an electron transport layer, and an electron injection layer in this order from the lower layer side.

The anode electrode (anode electrode) 22 is formed by layering Indium Tin Oxide (ITO) and an alloy containing Ag, and has light reflectivity. The cathode electrode 25 may be made of a transparent metal such as Indium Tin Oxide (ITO) or Indium Zinc Oxide (IZO).

When the light-emitting element layer 5 is an OLED layer, positive holes and electrons are recombined inside the EL layer 24 by a drive current between the anode electrode 22 and the cathode electrode 25. The recombination generates excitons, and light is emitted when the excitons fall into a ground state.

The light-emitting element layer 5 may be used not only in a case of constituting the OLED element, but also in a case of constituting an inorganic light emitting diode or quantum dot light emitting diode.

The sealing layer 6 includes the first inorganic sealing film 26 covering the edge cover 23 and the cathode electrode 25, the organic sealing film 27 covering the first inorganic sealing film 26, and the second inorganic sealing film 28 covering the organic sealing film 27.

Each of the first inorganic sealing film 26 and the second inorganic sealing film 28 may be formed of, for example, a silicon oxide film, a silicon nitride film, or a silicon oxynitride film, or a layered film thereof, formed by CVD. The organic sealing film 27 is a transparent organic insulating film that is thicker than the first inorganic sealing film 26 and the second inorganic sealing film 28, and may be formed of a coatable photosensitive organic material such as polyimide or acryl. For example, after the first inorganic sealing film 26 is coated, by an ink-jet method, with an ink containing such an organic material, the ink is cured by ultraviolet (UV) irradiation. The sealing layer 6 covers the light-emitting element layer 5 and inhibits foreign matters, such as water and oxygen, from infiltrating to the light-emitting element layer 5.

The protection material 9 is bonded to the sealing layer 6 through intermediation of the adhesive layer 8, and functions as a support material when the mother substrate 50 is peeled off. Examples of a material of the protection material 9 include polyethylene terephthalate (PET).

After the mother substrate 50 is peeled off, the support material 10 is bonded to the lower surface of the resin layer 12. As a result, an EL device having excellent flexibility is manufactured. Examples of the material for the support material 10 include polyethylene terephthalate (PET).

The function film has an optical compensation function, a touch sensor function, a protective function, and the like, for example. The electronic circuit board is an IC chip or a flexible printed circuit board that is mounted on a plurality of terminals TM, for example.

First Embodiment

First Bank and Second Bank

Description is made on the first bank 51 and the second bank 52 that are described above as the features of the disclosure.

Figure 7:
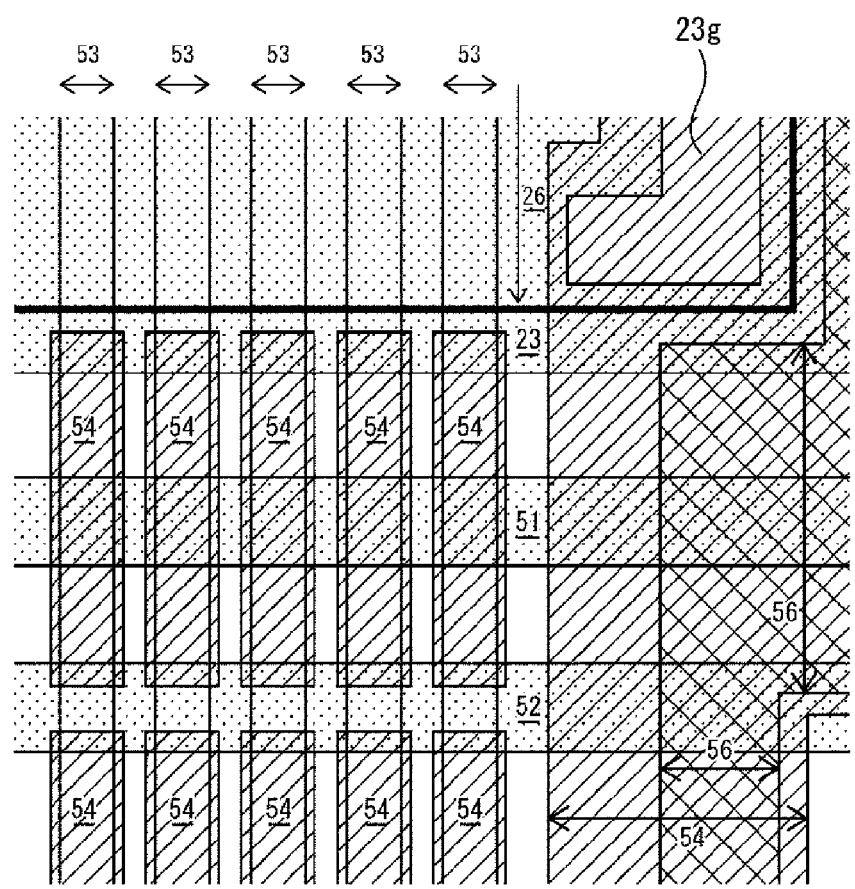
FIG. 7 is a partially enlarged view illustrating a schematic configuration of the EL device according to the embodiment of the disclosure.
Figure 8:
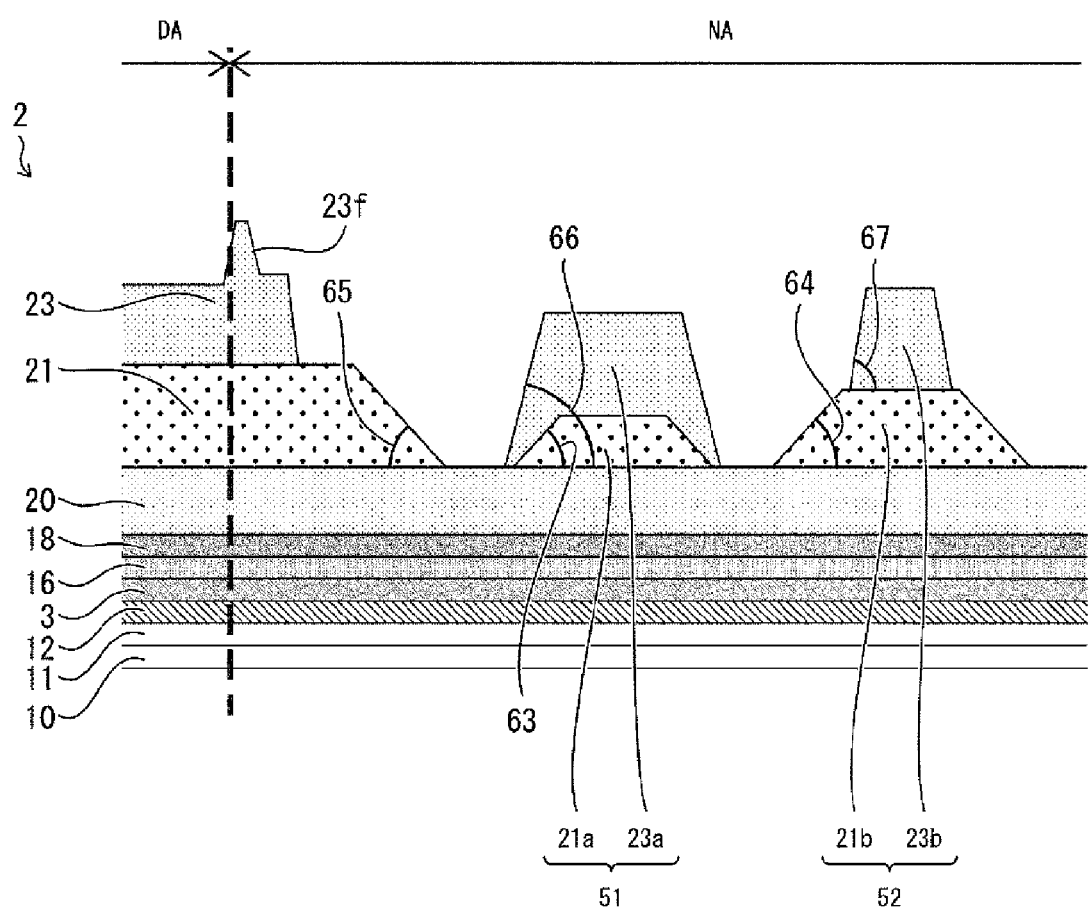
FIG. 8 is a cross-sectional view illustrating a schematic configuration of a first bank and a second bank according to the embodiment of the disclosure.

FIG. 7 is a partially enlarged view illustrating a schematic configuration of the EL device 2 according to the first embodiment. At a boundary between a display region DA and the non-display region NA and in the vicinity of the boundary that are illustrated in FIG. 8, FIG. 7 illustrates the boundary on a side close to the terminal portion 62 and the vicinity of the boundary. As illustrated in FIG. 7, the lead wiring line 53, the trunk wiring line 56, and a protective electrode 54 corresponding to each of the lead wiring line 53 and the trunk wiring line 56 intersect the first bank 51 and the second bank 52.

FIG. 8 is a cross-sectional view illustrating a schematic configuration of the first bank 51 and the second bank 52 according to the first embodiment. For simplification of illustration, in a structure on the inorganic insulating film 20, only the flattening film 21, the edge cover 23, the first bank 51 including a first bank lower portion 21a and a first bank upper portion 23a, and the second bank 52 including a second bank lower portion 21b and a second bank upper portion 23b are illustrated.

As illustrated in FIG. 6 to FIG. 8, the first bank 51 is formed in a frame shape, and surrounds the display region DA (display region). The first bank 51 includes the first bank lower portion 21a formed in the same layer as the flattening film 21 and the first bank upper portion 23a formed in the same layer as the edge cover 23. The second bank 52 is formed in a frame shape, and surrounds the display region DA and the first bank 51. The second bank 52 includes the second bank lower portion 21b formed in the same layer as the flattening film 21 and the second bank upper portion 23b formed in the same layer as the edge cover 23.

The first bank upper portion 23a covers the upper surface of the first bank lower portion 21a and at least the side surface thereof on a side close to the display region DA, and preferably covers both the upper surface and the two side surfaces. With this, at least an end portion of the protective electrode 54 (second conductive layer) creeping up the side surface of the first bank lower portion 21a on the side close to the display region DA can be covered to protect the end portion. Similarly, the second bank upper portion 23b covers the upper surface of the second bank lower portion 21b and at least the side surface thereof on a side close to the display region DA.

Further, at least on the side close to the terminal portion 62, an inclination angle 63 of the side surface of the first bank lower portion 21a is so small that a residue of the conductive material for forming the lead wiring line 53 and the trunk wiring line 56 is prevented from being left in a lower edge portion of the first bank lower portion 21a (the boundary portion between the side surface of the first bank lower portion 21a and the inorganic insulating film 20). Consequently, a short circuit (a leak between lines) can be prevented between the lead wiring lines 53 or between the lead wiring line 53 and the trunk wiring line 56 at the lower edge portion of the first bank lower portion 21a. Preferably, the inclination angle 63 of the side surface of the first bank lower portion 21a, which is on the side close to the display region DA, is smaller than inclination angles 66 and 67 of the side surfaces of the first bank upper portion 23a and the second bank upper portion 23b, which are on the side close to the display region DA.

Further, the inclination angle 63 of the side surface of the first bank lower portion 21a is small enough as described above. Thus, at the upper edge portion of the first bank lower portion 21a (the boundary portion between the side surface and the upper surface of the first bank lower portion 21a), breakage of the lead wiring line 53 and the trunk wiring line 56 can also be prevented. Further, the inclination angle of the side surface of the first bank 51 can be increased. Thus, the height of the first bank 51 can be increased enough so that the organic sealing film 27 is prevented from exceeding the first bank 51 and overflowing while attaining frame narrowing.

Similarly, at least on the side close to the terminal portion 62, the inclination angle 64 of the side surface of the second bank lower portion 21b is so small that a residue of the conductive material for forming the lead wiring line 53 and the trunk wiring line 56 is prevented from being left in a lower edge portion of the second bank lower portion 21b (the boundary portion between the side surface of the second bank lower portion 21b and the inorganic insulating film 20), Preferably, the inclination angle 64 of the side surface of the second bank lower portion 21b, which is on the side close to the display region DA, is smaller than inclination angles 66 and 67 of the side surfaces of the first bank upper portion 23a and the second bank upper portion 23b, which are on the side close to the display region DA. On the side close to the non-terminal portion other than the side close to the terminal portion 62, the inclination angles of the side surfaces of the first hank lower portion 21a and the second bank lower portion 21b may be larger or smaller than or may be equal to the inclination angles of the side surfaces of the first bank upper portion 23a and the second bank upper portion 23b.

Similarly, at least on the side close to the terminal portion 62, the inclination angle of the outer peripheral side surface of the flattening film 21 is so small that a residue of the conductive material for forming the lead wiring line 53 and the trunk wiring line 56 is prevented from being left in a lower edge portion of the flattening film 21 (the boundary portion between the outer peripheral side surface of the flattening film 21 and the inorganic insulating film 20).

Preferably, the height of the first bank 51 (the height from the lower surface of the first bank lower portion 21a to the upper surface of the first bank upper portion 23a) is smaller than the height of the second bank 52 (the height from the lower surface of the second bank lower portion 21b to the upper surface of the second bank upper portion 23b). The difference between the heights of the first bank 51 and the second bank 52 described above is preferably achieved by a difference between the height of the first bank lower portion 21a (the height from the lower surface of the first bank lower portion 21a to the upper surface of the first bank lower portion 21a) and the height of the second bank lower portion 21b (the height from the lower surface of the second bank lower portion 21b to the upper surface of the second bank lower portion 21b). In this case, the height of the first bank upper portion 23a (the height from the upper surface of the first bank lower portion 21a to the upper surface of the first bank upper portion 23a) and the height of the second bank upper portion 23b (the height from the upper surface of the second bank lower portion 21b to the upper surface of the second bank upper portion 23b) may be equivalent to each other.

Protective Electrode

Now, description is made on the protective electrode 54 described above as the features of the disclosure.

As illustrated in FIG. 7, the protective electrode 54 is formed in the same layer as the anode electrode 22 in such a manner to correspond to the lead wiring line 53 and the trunk wiring line 56. For an exposed portion (exposed from the flattening film 21, the first bank lower portion 21a, or the second bank lower portion 21b) of the corresponding lead wiring line 53 or the corresponding trunk wiring line 56, each of the protective electrodes is formed to cover at least a side surface of the exposed portion. Thus, during etching for forming the anode electrode 22, the exposed portions of the lead wiring line 53 and the trunk wiring line 56 can be prevented from being subjected to etching together.

The protective electrode that covers at least the side surface of the exposed portion is particularly effective in a case where the lead wiring line 53 and the trunk wiring line 56 are layered wiring lines formed by covering an upper surface of a conductive layer, which is formed of a material such as Al and Cu apt to be subjected to etching together with the anode electrode 22, with a fire-resistant metal such as Ti and Mo that is less likely to be subjected to etching together with the anode electrode 22. Meanwhile, in a case where the lead wiring line 53 and the trunk wiring line 56 are single-layer wiring lines of only a conductive layer formed of a material apt to be subjected to etching together with the anode electrode 22, the protective electrode 54 preferably covers the upper surface of the corresponding exposed portion in addition to the side surface thereof.

Manufacturing Method

Now, description is made on steps S3 and S4 that are described above as the features of the disclosure.

Formation of Lead Wiring Line and Trunk Wiring Line

First, the semiconductor film 15, the gate insulating film 16, the gate electrode G, and the inorganic insulating films 18 and 20 are sequentially formed, and the source electrode S, the drain electrode D, and the terminal wiring lines TW and the terminals TM are formed as upper layers of the inorganic insulating film 20.

Figure 9:
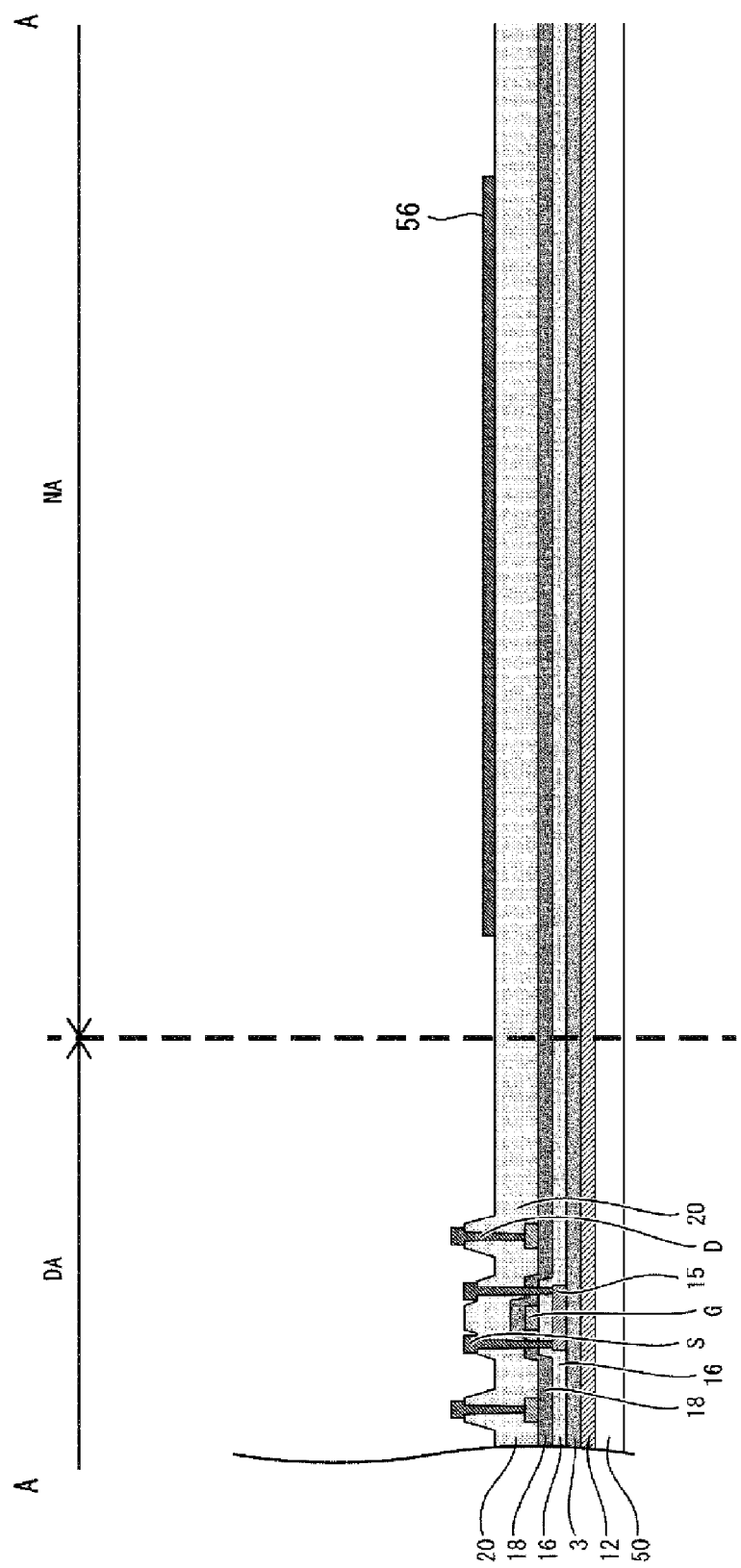
FIG. 9 is a cross-sectional view illustrating a configuration example of the EL device according to the embodiment of the disclosure before a flattening film is formed.
Figure 10:
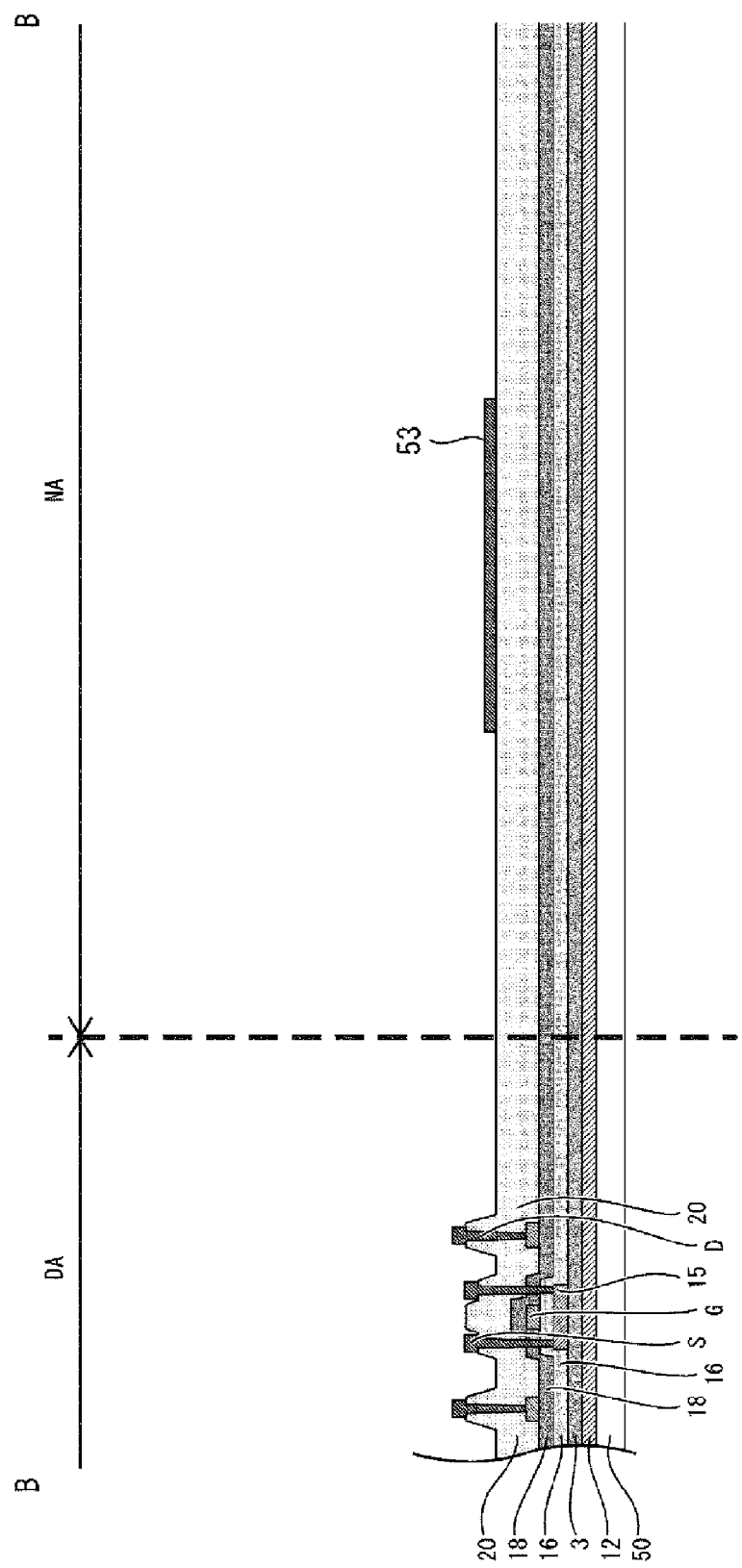
FIG. 10 is an another cross-sectional view illustrating a configuration example of the EL device according to the embodiment of the disclosure before the flattening film is formed.

FIG. 9 and FIG. 10 are different cross-sectional views illustrating a configuration example of the EL device 2 according to the first embodiment before the flattening film 21 is formed. FIG. 9 corresponds to a cross-sectional view taken along the line A-A in FIG. 6, and FIG. 10 corresponds to a cross-sectional view taken along the line B-B in FIG. 6.

As illustrated in FIG. 9 and FIG. 10, the plurality of lead wiring lines 53 and the plurality of trunk wiring lines 56 are formed in the same layer as the source electrode S. The lead wiring line 53 and the trunk wiring line 56 are formed at least in the region between the display region DA and the second bank 52. The lead wiring line 53 and the trunk wiring line 56 are illustrated in a short shape, but may extend longer. For example, the lead wiring line 53 and the trunk wiring line 56 may be formed into the display region DA and/or may exceed the second bank 52 to the terminal portion 62. The trunk wiring line 56 is a wiring line for supplying a power supply voltage from the terminal portion 62 to the cathode electrode 25, and the lead wiring line 53 is a wiring line for supplying a signal from the terminal portion to the wiring line of the display region DA.

Note that, in the illustrated configuration, all the three non-terminal portion sides are provided with the trunk wiring lines 56, but the configuration is not limited thereto. Only one or two non-terminal portion sides among the three non-terminal portion sides may be provided with the trunk wiring lines 56.

Formation of Flattening Film

Figure 11:
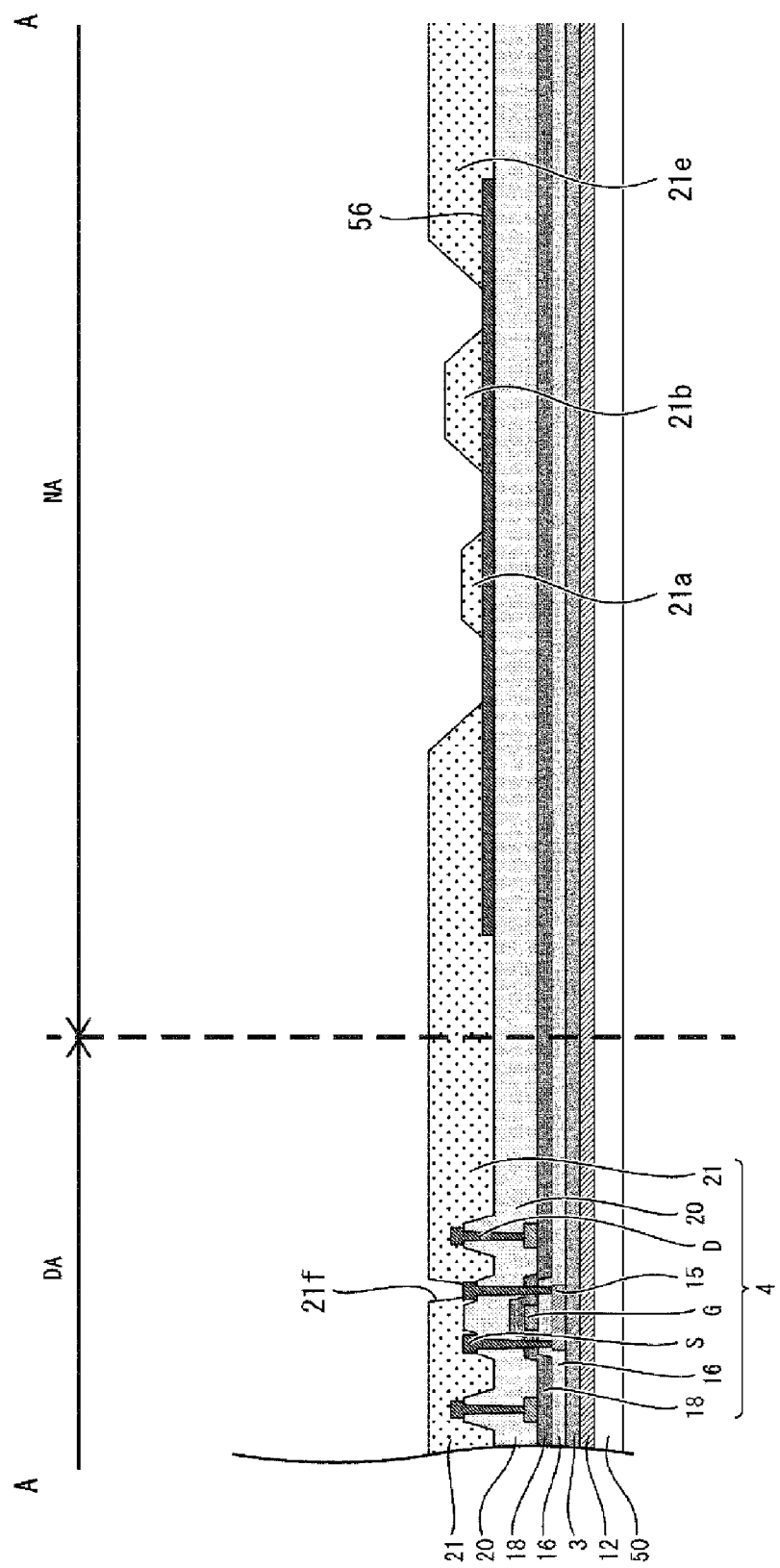
FIG. 11 is a cross-sectional view illustrating a configuration example of the EL device according to the embodiment of the disclosure after the flattening film is formed.
Figure 12:
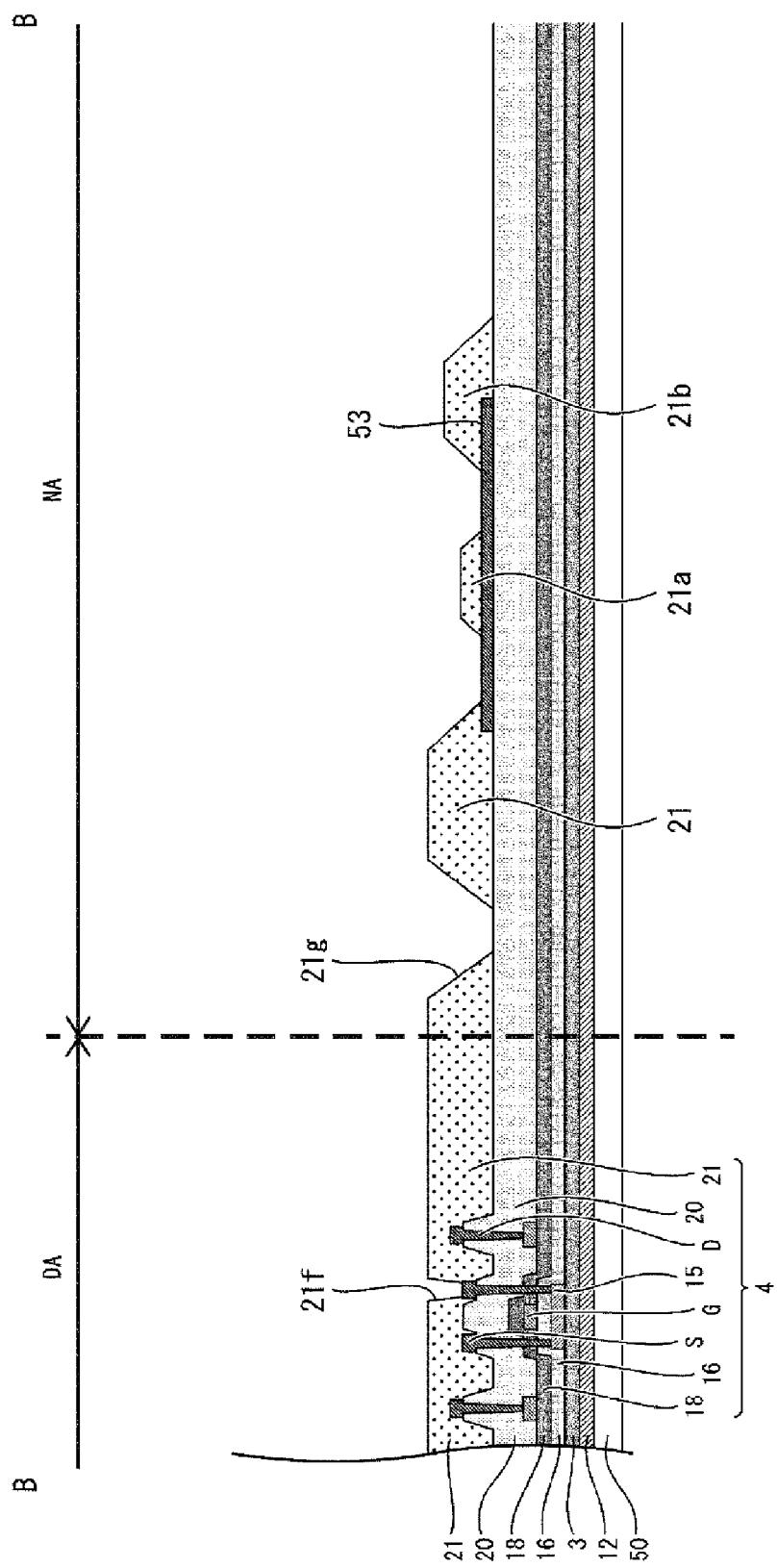
FIG. 12 is an another cross-sectional view illustrating a configuration example of the EL device according to the embodiment of the disclosure after the flattening film is formed.

FIG. 11 and FIG. 12 are different cross-sectional views illustrating a configuration example of the EL device 2 according to the first embodiment after the flattening film 21 is formed. FIG. 11 corresponds to a cross-sectional view taken along the line A-A in FIG. 6, and FIG. 12 corresponds to a cross-sectional view taken along the line B-B in FIG. 6.

Next, as illustrated in FIG. 11 and FIG. 12, the flattening film 21 is formed, and the first bank lower portion 21a for forming the first bank 51, the second bank lower portion 21b for forming the second bank 52, and a wiring line protecting portion 21e are formed in the same layer as the flattening film 21. Further, a plurality of contact holes 21f are provided in the flattening film 21 in such a manner that each of the contact holes 21f reaches the corresponding drain electrode D for each pixel.

Through use of a halftone mask or a graytone mask, the height of the second bank lower portion 21b can be greater than the height of the first bank lower portion 21a. Further, through use of a halftone mask and a graytone mask, the height of the flattening film 21 is greater than the height of the second bank lower portion 21b.

Preferably, a trench 21g is provided in the end portion of the flattening film 21, which is an end portion on a side with the trunk wiring line 56 provided. A plurality of trenches 21g may be provided. One trench 21g may be provided connecting with the flattening film 21. Alternatively, the trench 21g may be provided to divide the flattening film 21. An inclination angle of the side surface of the trench 21g is preferably large.

Formation of Anode Electrode, Relay Wiring Line, and Protective Electrode

Figure 13:
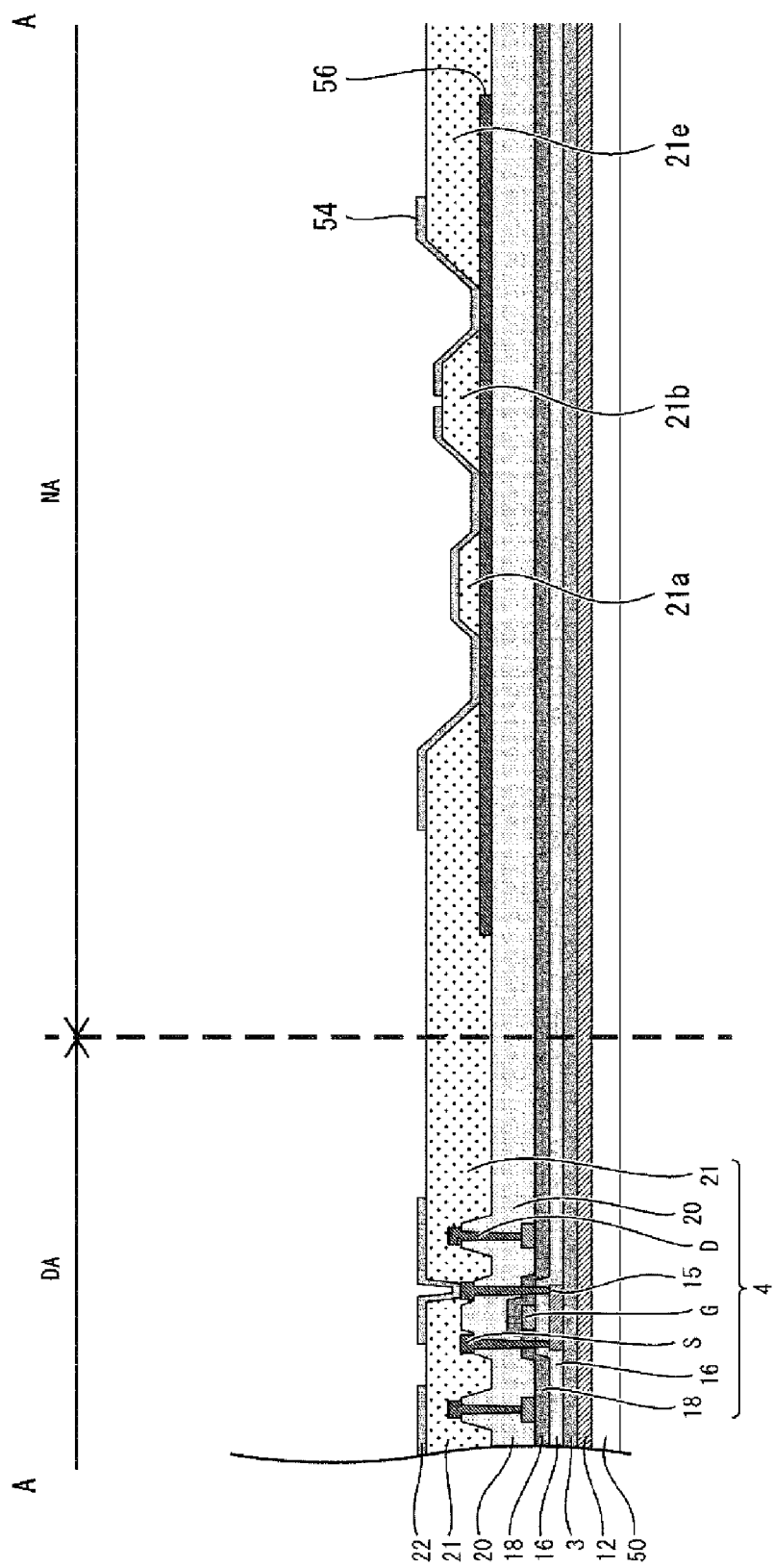
FIG. 13 is a cross-sectional view illustrating a configuration example of the EL device according to the embodiment of the disclosure after an anode electrode and a protective electrode are formed.
Figure 14:
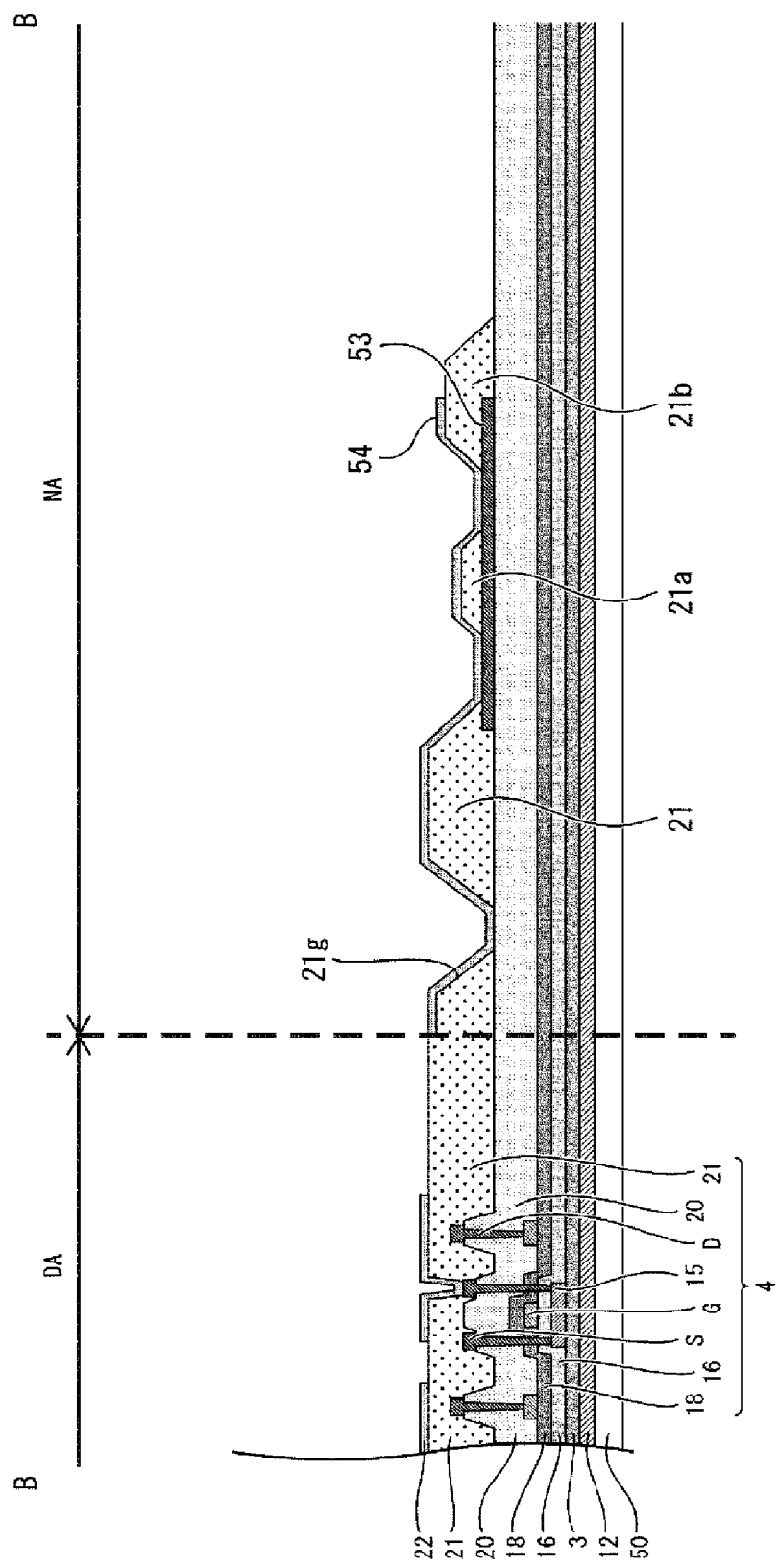
FIG. 14 is an another cross-sectional view illustrating a configuration example of the EL device according to the embodiment of the disclosure after the anode electrode and the protective electrode are formed.

FIG. 13 and FIG. 14 are different cross-sectional views illustrating a configuration example of the EL device 2 according to the first embodiment after the anode electrode 22 and the protective electrode 54 are formed. FIG. 13 corresponds to a cross-sectional view taken along the line A-A in FIG. 6, and FIG. 14 corresponds to a cross-sectional view taken along the line B-B in FIG. 6.

Next, as illustrated in FIG. 13 and FIG. 14, the anode electrode 22 is formed for each pixel, and the plurality of protective electrodes 54 are formed in the same layer as the anode electrode 22.

Each of the protective electrodes 54 is formed in such a manner to cover the corresponding lead wiring line 53 and the corresponding trunk wiring line 56 between the display region DA and the second bank 52 and to be electrically coupled to the corresponding lead wiring line 53 and the corresponding trunk wiring line 56. Preferably, each of the lead wiring line 53 and the trunk wiring line 56 is electrically coupled to the corresponding protective electrode 54 both between the flattening film 21 and the first bank 51 and between the first bank 51 and the second bank 52.

On the terminal portion side, each of the protective electrodes 54 covers the side surfaces of the corresponding lead wiring line 53 and the corresponding trunk wiring line 56. Thereby, side shift of the corresponding lead wiring line can be prevented.

Formation of Edge Cover

Figure 15:
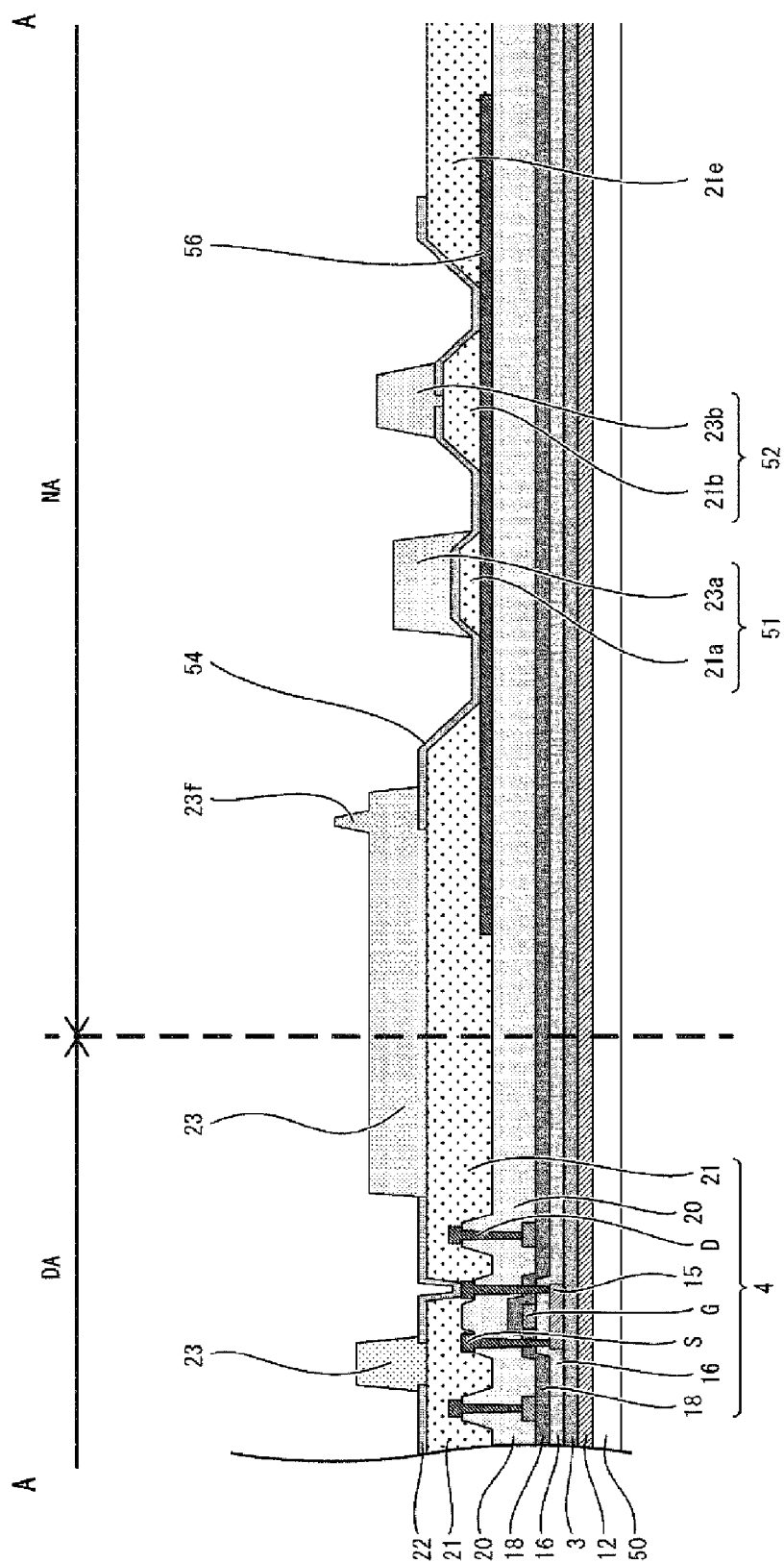
FIG. 15 is a cross-sectional view illustrating a configuration example of the EL device according to the embodiment of the disclosure after an edge cover is formed.
Figure 16:
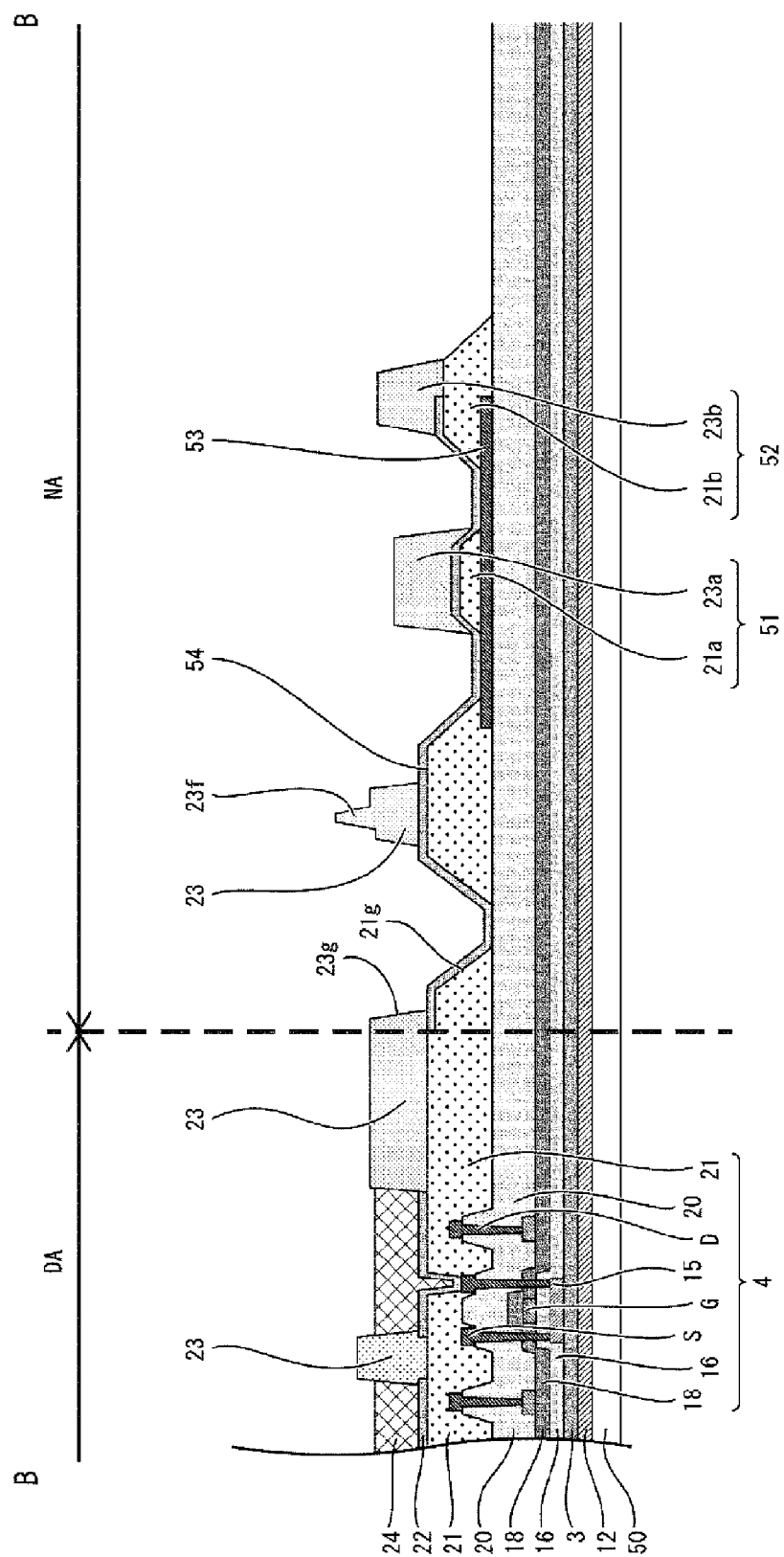
FIG. 16 is an another cross-sectional view illustrating a configuration example of the EL device according to the embodiment of the disclosure after the edge cover is formed.

FIG. 15 and FIG. 16 are cross-sectional views illustrating a configuration example of the EL device 2 according to the first embodiment after the edge cover 23 is formed. FIG. 15 corresponds to a cross-sectional view taken along the line A-A in FIG. 6, and FIG. 16 corresponds to a cross-sectional view taken along the line B-B in FIG. 6.

Next, as illustrated in FIG. 15 and FIG. 16, the edge cover 23 is formed to partition the pixels, and the first bank upper portion 23a overlapping the first bank lower portion 21a and the second bank upper portion 23b overlapping the second bank lower portion 21b are formed in the same layer as the edge cover 23. Preferably, a photo spacer 23f protruding from the upper surface of the edge cover 23 is formed in the same layer as the edge cover 23. The photo spacer 23f described above may be formed through use of a halftone mask or a graytone mask.

At the end portion of the edge cover 23, which is an end portion on a side with the trunk wiring line 56 provided, the trench 23g is provided in such a manner that the protective electrode 54 is exposed from the trench 23g. Preferably, the trench 21g and the trench 23g are provided in such a manner that the trench 21g of the flattening film 21 and the trench 23g of the edge cover 23 coincide with each other.

Formation of Cathode Electrode

Figure 17:
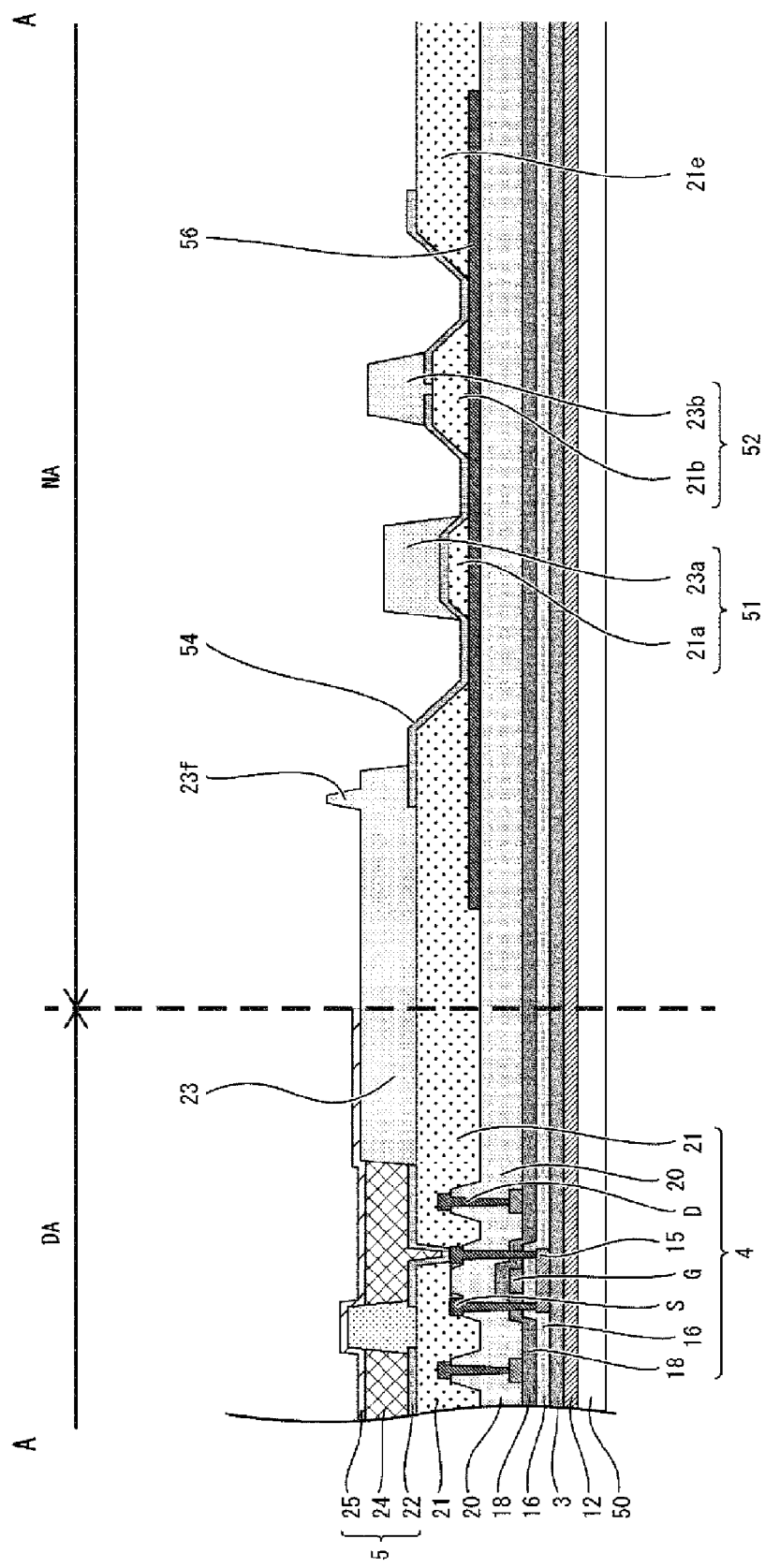
FIG. 17 is a cross-sectional view illustrating a configuration example of the EL device according to the embodiment of the disclosure after an EL layer and a cathode electrode are formed.
Figure 18:
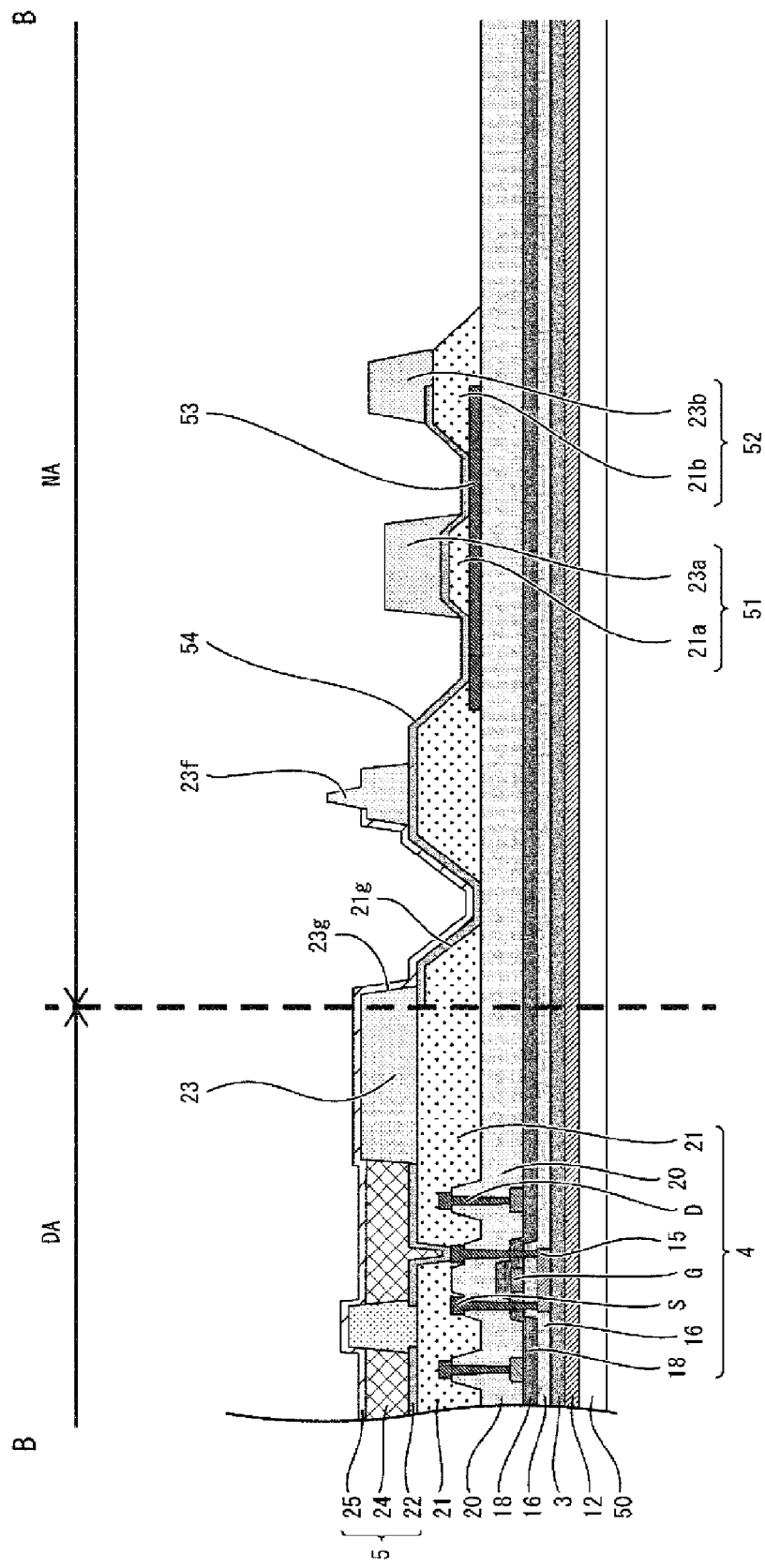
FIG. 18 is an another cross-sectional view illustrating a configuration example of the EL device according to the embodiment of the disclosure after the EL layer and the cathode electrode are formed.

FIG. 17 and FIG. 18 are cross-sectional views illustrating a configuration example of the EL device 2 according to the first embodiment after the layer 24 and the cathode electrode 25 are formed. FIG. 17 corresponds to a cross-sectional view taken along the line A-A in FIG. 6, and FIG. 18 corresponds to a cross-sectional view taken along the line B-B in FIG. 6.

Further, as illustrated in FIG. 17 and FIG. 18, the EL layer 24 is formed, and the cathode electrode 25 shared by the plurality of pixels is formed as an upper layer of the EL layer 24. The cathode electrode 25 is provided to directly overlap the protective electrode 54 exposed from the trenches 2g. Thus, the cathode electrode 25 is electrically coupled to the protective electrode 54. Thereby, the trunk wiring line 56 is electrically coupled to the cathode electrode 25 via the protective electrode 54.

MODIFICATION EXAMPLE

Figure 19:
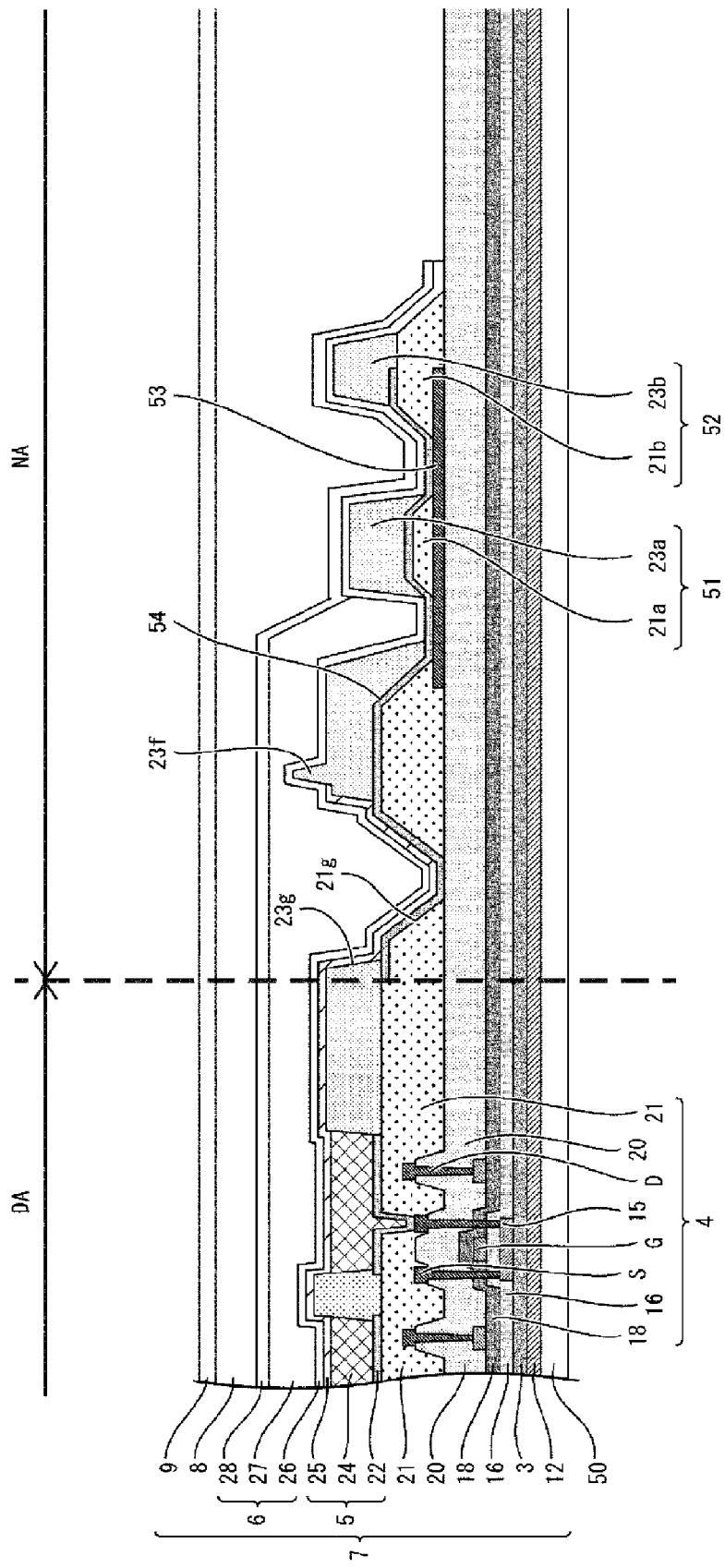
FIG. 19 is a cross-sectional view illustrating a schematic configuration of an EL device as a modification example of the EL device according to the embodiment of the disclosure.

FIG. 19 is a cross-sectional view illustrating a schematic configuration of an EL device 2' as a modification example of the EL device 2 according to the first embodiment.

As illustrated in FIG. 19, the edge cover 23 may cover an outer peripheral side surface of the flattening film 21.

Supplement

A display device (2, 2') according to a first aspect of the disclosure includes: an inorganic insulating film (20); a metal layer (S) as an upper layer of the inorganic insulating film (20); a flattening film (21) as an upper layer of the metal layer (S); a plurality of first electrodes (22) as an upper layer of the flattening film (21); an edge cover (23) as an upper layer of the plurality of first electrodes (22); a plurality of light-emitting layers (24) as an upper layer of the edge cover (23); a second electrode (25) as an upper layer of the plurality of light-emitting layers (24), the second electrode being shared by the plurality of light-emitting layers (24); a first bank (51) surrounding a display region (DA), the first bank (51) including a first bank lower portion (21a) in the same layer as the flattening film (21) and a first bank upper portion (23a) in the same layer as the edge cover (23); a second bank (52) surrounding the display region (DA) and the first bank (51), the second bank (52) including a second bank lower portion (21b) in the same layer as the flattening film (21) and a second bank upper portion (23b) in the same layer as the edge cover (23); and a terminal portion (62) on an outer side with respect to the second bank (52), wherein the first bank upper portion (23a) covers an upper surface and at least a side surface of the first bank lower portion (21a), the side surface being on a side close to the display region (DA), and an inclination angle (66) of a side surface of the first bank upper portion (23a) on a side close to the display region (DA) is larger than an inclination angle (63) of the side surface of the first bank lower portion (21a) on the side close to the display region (DA).

According to the configuration described above, the first bank upper portion covers the upper surface and the side surface of the first bank lower portion, the side surface being on the side close to the display region. Thus, the first bank upper portion can protect an end portion by covering the end portion of the protective electrode (the second conductive layer) creeping up the side surface of the first bank lower portion on the side close to the display region. Further, according to the configuration described above, the inclination angle of the side surface of the first bank upper portion on the side close to the display region (DA), is larger than the inclination angle of the side surface of the first bank lower portion on the side close to the display region. Thus, the height of the first bank as a whole can be increased without increasing the width of the bottom surface of the first bank as a whole. Thus, the display device attaining frame narrowing can be obtained. Further, a leak between lines can be prevented in the lower edge portion of the first bank lower portion on the side close to the display region. Further, at the upper edge portion of the first bank lower portion on the side close to the display region, breakage of the lead wiring line 53 and the trunk wiring line 56 can be prevented.

According to the first aspect, in the display device (2, 2') according to a second aspect of the disclosure, the second bank upper portion (23b) may cover an upper surface and at least a side surface of the second bank lower portion (21b), the side surface being on a side close to the display region (DA).

According to the configuration described above, the second bank upper portion (23b) covers the upper surface of the second bank lower portion (21b) and at least the side surface thereof on the side close to the display region (DA). Thus, the second bank upper portion can protect an end portion by covering the end portion of the protective electrode 54 (the second conductive layer) creeping up the side surface of the second bank lower portion on the side close to the display region.

According to the first aspect or the second aspect, in the display device (2, 2') according to a third aspect of the disclosure, an inclination angle of a side surface of the edge cover (23) may be larger than an inclination angle (65) of a side surface of the flattening film (21).

According to the configuration described above, the inclination angle of the side surface of the flattening film is smaller than the inclination angle of the side surface of the edge cover. Thus, a leak between lines in the lower edge portion and breakage at the upper edge portion of the flattening film can be prevented.

According to any one of the first aspect to the third aspect, in the display device (2, 2') according to a fourth aspect of the disclosure, an inclination angle of the side surface of the second bank lower portion (21b) may be smaller than an inclination angle of the side surface of the first bank upper portion (23a) and an inclination angle of a side surface of the second bank upper portion (23b).

According to the configuration described above, the inclination angle of the side surface of the first bank lower portion and the inclination angle of the side surface of the second bank lower portion are smaller than the inclination angles of the side surfaces of the first bank upper portion and the second bank upper portion. Thus, a leak between lines in the lower edge portion and breakage at the upper edge portion of the second bank lower portion can be prevented. Further, breakage of the lead wiring line 53 and the trunk wiring line 56 can also be prevented at the boundary portion between the side surfaces and the upper surfaces of the first bank lower portion and the second bank lower portion. Thus, the height of the second bank (52) as a whole can be increased without increasing the width of the bottom surface of the second bank as a whole. Thus, the display device attaining frame narrowing can be obtained.

According to any one of the first aspect to the fourth aspect, in the display device (2, 2') according to a fifth aspect of the disclosure, a height of the first bank (51) may be smaller than a height of the second bank (52).

According to any one of the first aspect to the fifth aspect, in the display device (2, 2') according to a sixth aspect of the disclosure, a height of the first bank lower portion (21a) may be smaller than a height of the second bank lower portion (21b).

According to any one of the first aspect to the sixth aspect, in the display device (2, 2') according to a seventh aspect of the disclosure, the height of the second bank lower portion (21b) may be smaller than a height of the flattening film (21).

According to any one of the first aspect to the seventh aspect, in the display device (2, 2') according to an eighth aspect of the disclosure, a height from the upper surface of the first bank lower portion (21a) to an upper surface of the first bank upper portion (23a) may be equivalent to a height from the upper surface of the second bank lower portion (21b) to an upper surface of the second bank upper portion (23b).

According to any one of the first aspect to the eighth aspect, the display device (2, 2') according to a ninth aspect of the disclosure may further include, in at least a part of a region between the display region (DA) and the second bank (52), a first conductive layer (53, 56) in the same layer as the metal layer (S), and a second conductive layer (54) in the same layer as the plurality of first electrodes (22), wherein the first conductive layer (53, 56) may include a trunk wiring line (56) for supplying a power source voltage to the second electrode (25), and the trunk wiring line (56) may be electrically coupled to the second electrode (25) via the second conductive layer (54).

According to the ninth aspect, in the display device (2, 2') according to a tenth aspect of the disclosure, an exposed portion of the trunk wiring line (56) may have at least a side surface covered correspondingly with the second conductive layer (54), the exposed portion being exposed from the flattening film (21) and a structure (21a, 21b, 21e) in the same layer as the flattening film (21).

According to the configuration described above, the exposed portion of the trunk wiring line has at least a side surface covered with the second conductive layer. Thus, during etching for forming the first electrode, the exposed portion of the trunk wiring line is prevented from being subjected to etching.

According to any one of the first aspect to the eighth aspect, the display device (2, 2') according to an eleventh aspect of the disclosure may further include, in a region between the display region (DA) and the terminal portion (62), a first conductive layer (53, 56) in the same layer as the metal layer (S), wherein the first conductive layer (53, 56) may include a lead wiring line (53) for supplying a signal from the terminal portion (62) to a wiring line in the display region (DA), and the lead wiring line (53) may be provided in such a manner to intersect the first bank (51) and the second bank (52).

According to the eleventh aspect, the display device (2, 2') according to a twelfth aspect of the disclosure may further include a second conductive layer (54) in the same layer as the plurality of first electrodes (22), wherein an exposed portion of the lead trunk wiring line (53) may have at least a side surface covered correspondingly with the second conductive layer (54), the exposed portion being exposed from the flattening film (21) and the structure (21a, 21b, 21e) in the same layer as the flattening film (21).

According to the configuration described above, the exposed portion of the lead wiring line has at least a side surface covered with the second conductive layer. Thus, during etching for forming the first electrode, the exposed portion of the lead wiring line is prevented from being subjected to etching.

According to any one of the first aspect to the twelfth aspect, the display device (2, 2') according to a thirteenth aspect of the disclosure may include a photo spacer (23f) in the same layer as the edge cover (23).

An electro-optical element (an electro-optical element of which luminance and transmittance are controlled by an electric current) included in the display device according to the present embodiment is not particularly limited. Examples of the display device according to the present embodiment include an organic Electro Luminescence (EL) display provided with an Organic Light Emitting Diode (PLED) as the electro-optical element, an inorganic EL display provided with an inorganic light emitting diode as the electro-optical element, and a Quantum dot Light Emitting Diode (QLED) display provided with a QLED as the electro-optical element.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A display device, comprising:
an inorganic insulating film;
a metal layer as an upper layer of the inorganic insulating film;
a flattening film as an upper layer of the metal layer;
a plurality of first electrodes as an upper layer of the flattening film;
an edge cover as an upper layer of the plurality of first electrodes;
a plurality of light-emitting layers as an upper layer of the edge cover;
a second electrode as an upper layer of the plurality of light-emitting layers, the second electrode being shared by the plurality of light-emitting layers;
a first bank surrounding a display region, the first bank including:
a first bank lower portion in the same layer as the flattening film; and
a first bank upper portion in the same layer as the edge cover;
a second bank surrounding the display region and the first bank, the second bank including:
a second bank lower portion in the same layer as the flattening film; and
a second bank upper portion in the same layer as the edge cover; and
a terminal portion on an outer side with respect to the second bank,
wherein the first bank upper portion covers an upper surface and at least a side surface of the first bank lower portion, the side surface being on a side close to the display region, and
an inclination angle of a side surface of the first bank upper portion on a side close to the display region is larger than an inclination angle of the side surface of the first bank lower portion on the side close to the display region.

2. The display device according to claim 1,
wherein the second bank upper portion covers an upper surface and at least a side surface of the second bank lower portion, the side surface being on a side close to the display region.

3. The display device according to claim 1,
wherein an inclination angle of a side surface of the edge cover is larger than an inclination angle of a side surface of the flattening film.

4. The display device according to claim 1,
wherein an inclination angle of the side surface of the second bank lower portion is smaller than an inclination angle of the side surface of the first bank upper portion and an inclination angle of a side surface of the second bank upper portion.

5. The display device according to claim 1,
wherein a height of the first bank is smaller than a height of the second bank.

6. The display device according to claim 1,
wherein a height of the first bank lower portion is smaller than a height of the second bank lower portion.

7. The display device according to claim 1,
wherein the height of the second bank lower portion is smaller than a height of the flattening film.

8. The display device according to claim 1,
wherein a height from the upper surface of the first bank lower portion to an upper surface of the first bank upper portion is equivalent to a height from the upper surface of the second bank lower portion to an upper surface of the second bank upper portion.

9. The display device according to claim 1, further comprising:
in at least a part of a region between the display region and the second bank,
a first conductive layer in the same layer as the metal layer; and
a second conductive layer in the same layer as the plurality of first electrodes,
wherein the first conductive layer includes a trunk wiring line configured to supply a power source voltage to the second electrode, and
the trunk wiring line is electrically coupled to the second electrode via the second conductive layer.

10. The display device according to claim 9,
wherein an exposed portion of the trunk wiring line has at least a side surface covered correspondingly with the second conductive layer, the exposed portion being exposed from the flattening film and a structure in the same layer as the flattening film.

11. The display device according to claim 1, further comprising:
in a region between the display region and the terminal portion, a first conductive layer in the same layer as the metal layer,
wherein the first conductive layer includes a lead wiring line configured to supply a signal from the terminal portion to a wiring line in the display region, and
the lead wiring line is provided in such a manner to intersect the first bank and the second bank.

12. The display device according to claim 11, further comprising:
a second conductive layer in the same layer as the plurality of first electrodes,
wherein an exposed portion of the lead wiring line has at least a side surface covered correspondingly with the second conductive layer, the exposed portion being exposed from the flattening film and the structure in the same layer as the flattening film.

13. The display device according to claim 1, further comprising:
a photo spacer in the same layer as the edge cover.

* * * * *